United States Patent
Yamazaki

(10) Patent No.: US 7,995,376 B2
(45) Date of Patent: Aug. 9, 2011

(54) SEMICONDUCTOR STORAGE DEVICE AND MANUFACTURING METHOD THEREOF

(75) Inventor: Daisuke Yamazaki, Kanagawa (JP)

(73) Assignee: Sony Corporation, Tokyo (JP)

( * ) Notice: Subject to any disclaimer, the term of this patent is extended or adjusted under 35 U.S.C. 154(b) by 423 days.

(21) Appl. No.: 12/329,851

(22) Filed: Dec. 8, 2008

(65) Prior Publication Data

US 2009/0146188 A1   Jun. 11, 2009

(30) Foreign Application Priority Data

Dec. 11, 2007   (JP) ................................ 2007-319327

(51) Int. Cl.
G11C 11/00   (2006.01)
(52) U.S. Cl. ........................................ 365/154; 365/156
(58) Field of Classification Search .................. 365/154, 365/156; 257/393, 903
See application file for complete search history.

(56) References Cited

U.S. PATENT DOCUMENTS

| | | | | |
|---|---|---|---|---|
| 6,128,218 | A * | 10/2000 | You et al. | 365/156 |
| 6,924,560 | B2 * | 8/2005 | Wang et al. | 257/67 |
| 7,009,871 | B1 * | 3/2006 | Kawasumi | 365/154 |

FOREIGN PATENT DOCUMENTS

| | | |
|---|---|---|
| JP | 10-335487 A | 12/1998 |
| JP | 11-195716 A | 7/1999 |
| JP | 2000-031298 | 1/2000 |
| JP | 2002-368135 A | 12/2002 |
| JP | 2003-060089 A | 2/2003 |
| JP | 2004-022809 A | 1/2004 |
| JP | 2005-327840 A | 11/2005 |
| JP | 2006-100340 A | 4/2006 |

OTHER PUBLICATIONS

Japanese Patent Office, Office Action issued in Patent Application JP 2007-319327, on Nov. 4, 2009.

* cited by examiner

Primary Examiner — Son T Dinh
(74) Attorney, Agent, or Firm — SNR Denton US LLP

(57) ABSTRACT

A semiconductor storage device includes a plurality of integrated memory cells. Each cell includes a first inverter having a first driver transistor and a first load transistor which are formed on a semiconductor substrate in order to form a first storage node, a second inverter having a second driver transistor and a second load transistor which are formed on the semiconductor substrate in order to form a second storage node, a first transfer transistor connected between the first storage node and a bit line to serve as a transistor connecting the memory cell to the bit line, and a second transfer transistor connected between the second storage node and a complementary-bit line to serve as a transistor connecting the memory cell to the complementary-bit line.

11 Claims, 12 Drawing Sheets

SEMICONDUCTOR STORAGE DEVICE AND MANUFACTURING METHOD THEREOF

CROSS REFERENCES TO RELATED APPLICATIONS

The present invention contains subject matter related Japanese Patent Application JP 2007-319327 filed in the Japan Patent Office on Dec. 11, 2007, the entire contents of which being incorporated herein by reference.

BACKGROUND OF THE INVENTION

1. Field of the Invention

The present invention relates to a semiconductor storage device and a manufacturing method thereof. In particular, the present invention relates to a semiconductor storage device employing SRAM (Static Random Access Memory) memory cells and a manufacturing method of the semiconductor storage device.

2. Description of the Related Art

A DRAM (Dynamic Random Access Memory) and an SRAM (Static Random Access Memory) are each widely used as a typical semiconductor storage device.

Some types of SRAM memory cells are known. For example, as one of the memory-cell types, the SRAM memory cell employs at least a total of six MOSFETs (Metal-Oxide-Semiconductor Field Effect Transistors). The six MOSFETS are two PMOS (P-channel Metal-Oxide-Semiconductor) transistors and four NMOS (N-channel Metal-Oxide-Semiconductor) transistors.

In comparison with a semiconductor storage device requiring components such as a capacitor used specially as a memory in addition to transistors like DRAMs, the SRAM offers merits such as a process compatible with the pure logic process, simple peripheral circuits and a high access speed. In comparison with the DRAM requiring an operation to refresh data stored in the DRAM, the peripheral circuits of the SRAM can be made simple because an operation to refresh data stored in the SRAM is not required. Because of these merits, the SRAM is widely used as a semiconductor storage device which is required to have a high access speed and simple peripheral circuits but needs to have only a relatively small storage capacity. Examples of the semiconductor storage device are a cache memory and a memory employed in a portable terminal.

FIG. 9A is a circuit diagram showing an equivalent circuit of an SRAM memory cell employing six MOSFETs. Typically, the six MOSFETS are two PMOS transistors and four NMOS transistors. In the equivalent circuit, the two PMOS transistors are a first load transistor LTr1 and a second load transistor LTr2. On the other hand, the four NMOS transistors are a first driver transistor DTr1, a second driver transistor DTr2, a first transfer transistor TTr1 and a second transfer transistor TTr2.

The drains of the first load transistor LTr1 and the first driver transistor DTr1 are connected to a first storage node ND whereas the gates of the first load transistor LTr1 and the first driver transistor DTr1 are connected to a second storage node ND/. The source of the first load transistor LTr1 is connected to a power-supply voltage Vc whereas the source of the first driver transistor DTr1 is connected to a reference electric potential Vs. In this configuration, the first load transistor LTr1 and the first driver transistor DTr1 form a first CMOS inverter employing the second storage node ND/ as the input terminal and the first storage node ND as the output terminal.

On the other hand, the drains of the second load transistor LTr2 and the second driver transistor DTr2 are connected to the second storage node ND/ whereas the gates of the second load transistor LTr2 and the second driver transistor DTr2 are connected to the first storage node ND. The source of the second load transistor LTr2 is connected to the power-supply voltage Vc whereas the source of the second driver transistor DTr2 is connected to the reference electric potential Vs. In this configuration, the second load transistor LTr2 and the second driver transistor DTr2 form a second CMOS inverter employing the first storage node ND as the input and the second storage node ND/ as the output.

Thus, the input of the first CMOS inverter composed of the first load transistor LTr1 and the first driver transistor DTr1 as described above is connected to the output of the second CMOS inverter composed of the second load transistor LTr2 and the second driver transistor DTr2 as described above whereas the output of the first CMOS inverter is connected to the input of the second CMOS inverter to form a ring functioning as a storage circuit.

The gate, drain and source of the first transfer transistor TTr1 are connected to a word line WL, a bit line BL and the first storage node ND respectively. By the same token, the gate, drain and source of the second transfer transistor TTr2 are connected to the word line WL, a complementary-bit line BL/ and the second storage node ND/ respectively.

FIG. 9B is a top view showing a layout of the SRAM memory cell MC having an equivalent circuit shown in the circuit diagram of FIG. 9A. In recent years, the area of a memory cell MC is contracted in an attempt to increase the density of a semiconductor storage device. In many SRAMs of 90 nm and 65 nm generations, a point-symmetrical memory cell like the one shown in the top view of FIG. 9B is used.

As shown in the top view of FIG. 9B, a first P-type semiconductor area P1, a second P-type semiconductor area P2, a first N-type semiconductor area N1 and a second N-type semiconductor area N2 are isolated from each other by a device isolating insulation film I. Each of the first P-type semiconductor area P1, the second P-type semiconductor area P2, the first N-type semiconductor area N1 and the second N-type semiconductor area N2 is typically configured as a well formed on a semiconductor substrate.

On the layout shown in the top view of FIG. 9B, a first gate electrode G1, a second gate electrode G2, a third gate electrode G3, and a fourth gate electrode G4 are formed to cross each of corresponding semiconductor areas described above. In addition, on each surface of semiconductor areas excluding each area for forming each gate electrode, source and drain areas are formed to form each of the first and second load transistors LTr1 and LTr2 each serving as PMOS transistor, the first and second driver transistors DTr1 and DTr2 each serving as NMOS transistors, and the first and second transfer transistors TTr1 and TTr2 each serving as NMOS transistors.

An opening is formed to start continuously from the source and drain area of the first load transistor LTr1 formed to operate as a PMOS transistor to an area covering the third gate electrode G3, and a common contact SCT1 is provided in the opening to connect the source and drain area of the first load transistor LTr1 to the third gate electrode G3.

On the other hand, an opening is formed in the source and drain area connecting the first driver transistor DTr1 to the first transfer transistor TTr1, and a contact CT1 is provided in the opening. The contact CT1 is connected to the common contact SCT1 by an upper-layer wire (not shown in FIG. 9B) to form the first storage node ND in the equivalent circuit shown in the circuit diagram of FIG. 9A.

By the same token, an opening is formed to start continuously from the source and drain area of the second load transistor LTr2 formed to operate as a PMOS transistor to an area covering the first gate electrode G1, and a common contact SCT2 is provided in the opening to connect the source and drain area of the second load transistor LTr2 to the first gate electrode G1.

On the other hand, an opening is formed in the source and drain area connecting the second driver transistor DTr2 to the second transfer transistor TTr2, and a contact CT2 is provided in the opening.

In the same way as the contact CT1 is connected to the common contact SCT1 as described above, the contact CT2 is connected to the common contact SCT2 by an upper-layer wire (not shown in FIG. 9B) to form the second storage node ND/ in the equivalent circuit shown in the circuit diagram of FIG. 9A.

The source and drain areas are connected to upper-layer wires through their respective contacts in order to wire the source and drain areas to the power-supply voltage Vc, the reference electric potential Vs, the bit line BL and the complementary-bit line BL/.

The components connected to each other as described above form a memory cell MC.

In the SRAM having the configuration described above, each memory cell MC employs NMOS and PMOS transistors. With the area of the memory cell MC contracted, the gaps between the NMOS and PMOS transistors become narrow too. That is to say, the gaps between the first P-type semiconductor area P1, the second P-type semiconductor area P2, the first N-type semiconductor area N1 and the second N-type semiconductor area N2 which are formed on the semiconductor substrate become narrow.

The following description explains a method of manufacturing an SRAM employing memory cells MC each having the configuration described above.

FIG. 10A is a top view of first N-type semiconductor areas N1 and N3, second N-type semiconductor areas N2 and N4, first P-type semiconductor areas P1 and P3 as well as second P-type semiconductor areas P2 and P4 in a process to form each of the areas as a well on a semiconductor substrate 10 by adoption of the method. On the other hand, FIG. 10B is a cross-sectional diagram showing a model of the cross section of the semiconductor areas shown in the top view of FIG. 10A.

Each of the diagrams of FIGS. 10A and 10B shows two memory cells MC1 and MC2 which are adjacent to each other. The area of the memory cell MC1 includes the first P-type semiconductor area P1 for NMOS transistors, the second P-type semiconductor area P2 for NMOS transistors, the first N-type semiconductor area N1 for a PMOS transistor and the second N-type semiconductor area N2 for a PMOS transistor. By the same token, the area of the memory cell MC2 includes the first P-type semiconductor area P3 for NMOS transistors, the second P-type semiconductor area P4 for NMOS transistors, the first N-type semiconductor area N3 for a PMOS transistor and the second N-type semiconductor area N4 for a PMOS transistor.

First of all, a device separating isolation film I is formed on the semiconductor substrate 10 to separate active area segments from each other as shown in FIG. 10B. Then, each of areas allocated to the first P-type semiconductor areas P1 and P3 as well as the second P-type semiconductor areas P2 and P4 is protected by a mask such as a resist film. Subsequently, ions each serving as an impurity of n-type conductivity are injected in an ion injection process to form the first N-type semiconductor areas N1 and N3 as well as the second N-type semiconductor areas N2 and N4.

Then, each of the first N-type semiconductor areas N1 and N3 as well as the second N-type semiconductor areas N2 and N4 is protected by a mask MK such as a resist film as shown in FIGS. 10A and 10B. Subsequently, ions each serving as an impurity of p-type conductivity are injected to form the first P-type semiconductor areas P1 and P3 as well as the second P-type semiconductor areas P2 and P4.

Ions each serving as a conductive impurity are injected in the above process in a direction forming an angle relative to the surface of the semiconductor substrate 10.

Let us think of a case in which the creation positions of the formed masks MK for protecting the first N-type semiconductor areas N1 and N3 as well as the second N-type semiconductor areas N2 and N4 are inadvertently shifted in the process of forming the first P-type semiconductor areas P1 and P3 as well as the second P-type semiconductor areas P2 and P4.

FIG. 11A is a top view of the first P-type semiconductor areas P1 and P3 as well as the second P-type semiconductor areas P2 and P4 in a process to form each of the first P-type semiconductor areas P1 and P3 as well as the second P-type semiconductor areas P2 and P4 on the semiconductor substrate 10 as a well. The creation position of each of the masks MK is undesirably shifted from its supposed position $MK_0$ to the right direction in the top view of FIG. 11A. FIG. 11B is a top view showing a relation between the layout patterns of the memory cells MC1 and MC2 adjacent to each other.

As shown in the top view of FIG. 11A, in the memory cell MC1, the mask MK is moved to a position farther from the first P-type semiconductor area P1 but closer to the second P-type semiconductor area P2 than the supposed mask position $MK_0$.

In the memory cell MC2, on the other hand, the mask MK is moved to a position farther from the second P-type semiconductor area P4 but closer to the first P-type semiconductor area P3 than the supposed mask position $MK_0$. This is because, for the purpose of allowing contacts to be shared by the memory cells MC1 and MC2 and other purposes, the layout patterns of the memory cells MC1 and MC2 are deliberately made symmetrical in the horizontal direction with respect to the center vertical line or the layout patterns of the memory cells MC1 and MC2 are deliberately made opposite to each other in the horizontal direction as shown in the top view of FIG. 11B.

FIG. 12 is a model cross-sectional diagram referred to in description of problems raised by the hitherto known technology. An NMOS area $A_{NMOS}$ shown in the model cross-sectional diagram of FIG. 12 is an enlarged figure of a P-type semiconductor area shown in the diagrams of FIGS. 10A to 11B as a semiconductor area for forming NMOS transistors. On the other hand, a PMOS area $A_{PMOS}$ shown in the model cross-sectional diagram of FIG. 12 is an enlarged figure of an N-type semiconductor area shown in the diagrams of FIGS. 10A to 11B as a semiconductor area for forming a PMOS transistor.

In the model cross-sectional diagram of FIG. 12, the NMOS area $A_{NMOS}$ is the second P-type semiconductor area P2. With a mask MK placed at a location close to the second P-type semiconductor area P2 as shown in the model cross-sectional diagram of FIG. 12, due to an inclined ion injection direction denoted by notation II, a shadow is cast by the mask MK on an area SH, resulting in inadequate ion injection onto the area SH.

As a result, in a transistor with conductive impurities not injected thereto at a design concentration in an ion injection process, the characteristic of the transistor is not fixed. Since conductive impurities are not injected into the first P-type semiconductor area P1 of the memory cell MC1 at a design concentration in an ion injection process, the characteristic of each of the first driver transistor DTr1 and the first transfer transistor TTr1 is not fixed inadvertently. By the same token, since conductive impurities are not injected into the second P-type semiconductor area P2 of the memory cell MC1 at a design concentration in an ion injection process, the characteristic of each of the second driver transistor DTr2 and the second transfer transistor TTr2 is also not fixed inadvertently either.

If the characteristic undesirably varies much from transistor to transistor in the same memory cell MC as described above, the characteristics of the SRAM deteriorate. The characteristics of the SRAM include a characteristic to write data into memory cell MC in the SRAM, a characteristic to hold the written data in the memory cell MC and a characteristic to read out the data held in the memory cell MC from the memory cell MC.

As described above, the layout patterns of the memory cells MC1 and MC2 are deliberately made symmetrical in the horizontal direction with respect to the center vertical line or the layout patterns of the memory cells MC1 and MC2 are deliberately made opposite to each other in the horizontal direction as shown in the top view of FIG. 11B. Thus, the creation position of the mask MK on the memory cell MC1 is shifted in a direction opposite to the direction in which the mask MK on the memory cell MC2 is shifted. As a result, the characteristics of the memory cell MC1 are shifted in a direction opposite to the direction in which the characteristics of the memory cell MC2 are shifted. That is, the characteristics of a memory cell MC vary from cell to cell so that the characteristics of the SRAM deteriorate as described above.

Unlike what has been described above, Japanese Patent Laid-open No. 2000-31298 (patent document 1) discloses a layout in which the first transfer transistor TTr1, the first driver transistor DTr1, the second driver transistor DTr2 and the second transfer transistor TTr2, which compose a memory cell MC of an SRAM, are connected in series and aligned to form a straight line.

In the layout disclosed in patent document 1, for the purpose of allowing contacts to be shared, it is natural to deliberately make the layout patterns of the memory cells MC1 and MC2 symmetrical in the horizontal direction with respect to the center vertical line or deliberately make the layout patterns of the memory cells MC1 and MC2 opposite to each other in the horizontal direction. Thus, if the creation positions of the masks MK are shifted, the characteristics of a memory cell MC vary from cell to cell so that the characteristics of the SRAM deteriorate.

SUMMARY OF THE INVENTION

In view of the above problems, it is desirable to provide a semiconductor storage device capable of reducing the number of variations caused by shifted creation positions of masks in a manufacturing process to appear as characteristic variations from transistor to transistor and a method for manufacturing the semiconductor storage device.

According to one embodiment of the present invention, there is provided a semiconductor storage device employing a plurality of integrated memory cells each including:

a first inverter having a first driver transistor and a first load transistor which are formed on a semiconductor substrate in order to form a first storage node;

a second inverter having a second driver transistor and a second load transistor which are formed on the semiconductor substrate in order to form a second storage node;

a first transfer transistor connected between the first storage node and a bit line to serve as a transistor connecting the memory cell to the bit line; and a second transfer transistor connected between the second storage node and a complementary-bit line to serve as a transistor connecting the memory cell to the complementary-bit line.

Each of the memory cells has a layout in which:

the first transfer transistor, the first driver transistor, the second driver transistor and the second transfer transistor are connected in series and provided in a first semiconductor area formed as a segment having the shape of a straight line on the semiconductor substrate;

the first load transistor is provided in a second semiconductor area formed as a segment on the semiconductor substrate;

the second load transistor is provided in a third semiconductor area formed as a segment on the semiconductor substrate; and the first semiconductor area is sandwiched by the second semiconductor area and the third semiconductor area.

Thus, each of a plurality of aforementioned memory cells employed in the semiconductor storage device provided by the present embodiment has six transistors, i.e., the first driver transistor, the first load transistor, the first transfer transistor, the second driver transistor, the second load transistor and the second transfer transistor. The first driver transistor and the first load transistor together form the first inverter including the first storage node whereas the second driver transistor and the second load transistor together form the second inverter including the second storage node. The first storage node is connected to the bit line through the first transfer transistor whereas the second storage node is connected to the complementary-bit line through the second transfer transistor.

Each of the memory cells has a layout in which:

the first transfer transistor, the first driver transistor, the second driver transistor and the second transfer transistor are connected in series and provided in a first semiconductor area formed as a segment having the shape of a straight line on the semiconductor substrate;

the first load transistor is provided in a second semiconductor area formed as a segment on the semiconductor substrate;

the second load transistor is provided in a third semiconductor area formed as a segment on the semiconductor substrate; and the first semiconductor area is sandwiched by the second semiconductor area and the third semiconductor area.

According to one embodiment of the present invention, there is provided a method for manufacturing a semiconductor storage device employing a plurality of integrated memory cells each including:

a first inverter having a first driver transistor and a first load transistor which are formed on a semiconductor substrate in order to form a first storage node;

a second inverter having a second driver transistor and a second load transistor which are formed on the semiconductor substrate in order to form a second storage node;

a first transfer transistor connected between the first storage node and a bit line to serve as a transistor connecting the memory cell to the bit line; and a second transfer transistor connected between the second storage node and a complementary-bit line to serve as a transistor connecting the memory cell to the complementary-bit line.

The method for manufacturing a semiconductor storage device includes the steps of:

carrying out a process of forming a first semiconductor area formed as a segment having the shape of a straight line on the semiconductor substrate to serve as an area in which the first transfer transistor, the first driver transistor, the second driver transistor and the second transfer transistor are provided by connecting the first transfer transistor, the first driver transistor, the second driver transistor and the second transfer transistor to each other in series, forming a second semiconductor area formed as a segment on the semiconductor substrate to serve as an area in which the first load transistor is provided and forming a third semiconductor area formed as a segment on the semiconductor substrate to serve as an area in which the second load transistor is provided;

carrying out a process of forming gate insulation films composing the first driver transistor, the first load transistor, the first transfer transistor, the second driver transistor, the second load transistor and the second transfer transistor in the first semiconductor area, the second semiconductor area and the third semiconductor area;

carrying out a process of forming gate electrodes of the first driver transistor, the first load transistor, the first transfer transistor, the second driver transistor, the second load transistor and the second transfer transistor on the gate insulation films in the first semiconductor area, the second semiconductor area and the third semiconductor area; and carrying out a process of forming source and drain areas composing the first driver transistor, the first load transistor, the first transfer transistor, the second driver transistor, the second load transistor and the second transfer transistor in the first semiconductor area, the second semiconductor area and the third semiconductor area.

In a process to form the first semiconductor area, the second semiconductor area and the third semiconductor area, a layout is formed on the semiconductor substrate as a layout in which the first semiconductor area is sandwiched by the second semiconductor area and the third semiconductor area.

That is to say, the present embodiment provides a method for manufacturing a semiconductor storage device employing a plurality of integrated memory cells each of which has six transistors, i.e., the first driver transistor, the first load transistor, the first transfer transistor, the second driver transistor, the second load transistor and the second transfer transistor. The first driver transistor and the first load transistor together form the first inverter including the first storage node whereas the second driver transistor and the second load transistor together form the second inverter including the second storage node. The first storage node is connected to the bit line through the first transfer transistor whereas the second storage node is connected to the complementary-bit line through the second transfer transistor.

First of all, each of the memory cells is formed to have a layout in which:

the first transfer transistor, the first driver transistor, the second driver transistor and the second transfer transistor are connected in series and provided in a first semiconductor area formed as a segment having the shape of a straight line on the semiconductor substrate;

the first load transistor is provided in a second semiconductor area formed as a segment on the semiconductor substrate;

the second load transistor is provided in a third semiconductor area formed as a segment on the semiconductor substrate; and the first semiconductor area is sandwiched by the second semiconductor area and the third semiconductor area.

Then, gate insulation films composing the above transistors are formed in the first semiconductor area, the second semiconductor area and the third semiconductor area. Subsequently, gate electrodes of the above transistors are formed on the gate insulation films in the first semiconductor area, the second semiconductor area and the third semiconductor area. Finally, source and drain areas composing the above transistors are formed in the first semiconductor area, the second semiconductor area and the third semiconductor area.

In a layout on the semiconductor substrate of the semiconductor storage device provided by the one embodiment of the present invention, the second semiconductor area with the first load transistor provided therein and the third semiconductor area with the second load transistor provided therein sandwich the first semiconductor area in which the first driver transistor, the first transfer transistor, the second driver transistor and the second transfer transistor are formed. Thus, even if the creation positions of masks MK are shifted in a manufacturing process, it is possible to reduce the number of characteristic variations from transistor to transistor.

In addition, as a result of adopting the method provided by the another embodiment of the present invention as a method for manufacturing a semiconductor storage device, in a layout on the semiconductor substrate of the semiconductor storage device, the second semiconductor area with the first load transistor provided therein and the third semiconductor area with the second load transistor provided therein sandwich the first semiconductor area in which the first driver transistor, the first transfer transistor, the second driver transistor and the second transfer transistor are formed. Thus, even if the creation positions of masks MK are shifted in a manufacturing process, it is possible to reduce the number of characteristic variations from transistor to transistor.

DETAILED DESCRIPTION OF THE PREFERRED EMBODIMENTS

By referring to diagrams, the following description explains a semiconductor storage device and a method for manufacturing a semiconductor storage device in accordance with preferred embodiments of the present invention.

First Embodiment

Figure 1:
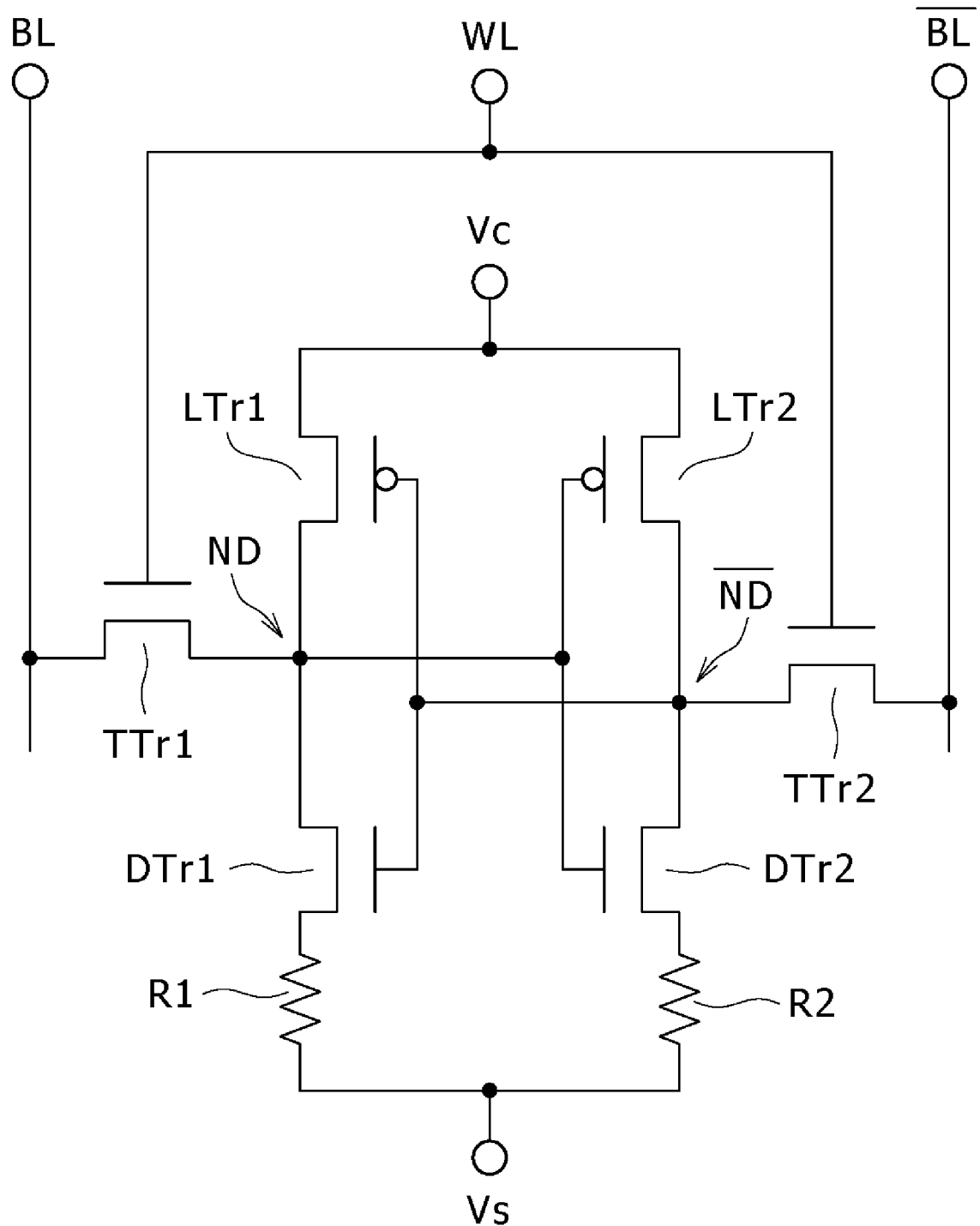
FIG. 1 is a circuit diagram showing an equivalent circuit of a memory cell provided with six MOSFETs to serve as a cell employed in an SRAM used as a semiconductor storage device according to a first embodiment of the present invention.

FIG. 1 is a circuit diagram showing an equivalent circuit of a memory cell MC provided with six MOSFETs to serve as a cell employed in an SRAM used as a semiconductor storage device according to a first embodiment of the present invention. The SRAM according to the first embodiment employs a plurality of memory cells MC each having the configuration shown in the circuit diagram of FIG. 1.

Each of the memory cells MC typically includes two PMOS transistors, i.e., a first load transistor LTr1 and a second load transistor LTr2, two NMOS transistors, i.e., a first driver transistor DTr1 and a second driver transistor DTr2 as well as two other NMOS transistors, i.e., a first transfer transistor TTr1 and a second transfer transistor TTr2.

Typically, the drains of the first load transistor LTr1 and the first driver transistor DTr1 are connected to a first storage node ND whereas the gates of the first load transistor LTr1 and the first driver transistor DTr1 are connected to a second storage node ND/. The source of the first load transistor LTr1 is connected to a power-supply voltage Vc whereas the source of the first driver transistor DTr1 is connected to a reference electric potential Vs. In this configuration, the first load transistor LTr1 and the first driver transistor DTr1 form a first CMOS inverter employing the second storage node ND/ as the input and the first storage node ND as the output.

On the other hand, the drains of the second load transistor LTr2 and the second driver transistor DTr2 are typically connected to the second storage node ND/ whereas the gates of the second load transistor LTr2 and the second driver transistor DTr2 are connected to the first storage node ND. The source of the second load transistor LTr2 is connected to the power-supply voltage Vc whereas the source of the second driver transistor DTr2 is connected to the reference electric potential Vs. In this configuration, the second load transistor LTr2 and the second driver transistor DTr2 form a second CMOS inverter employing the first storage node ND as the input and the second storage node ND/ as the output.

Thus, the input of the first CMOS inverter composed of the first load transistor LTr1 and the first driver transistor DTr1 as described above is connected to the output of the second CMOS inverter composed of the second load transistor LTr2 and the second driver transistor DTr2 as described above whereas the output of the first CMOS inverter is connected to the input of the second CMOS inverter to form a ring functioning as a storage circuit which is called a flip-flop.

The gate, drain and source of the first transfer transistor TTr1 are connected to a word line WL, a bit line BL and the first storage node ND respectively. By the same token, the gate, drain and source of the second transfer transistor TTr2 are connected to the word line WL, a complementary-bit line BL/ and the second storage node ND/ respectively.

Figure 2:
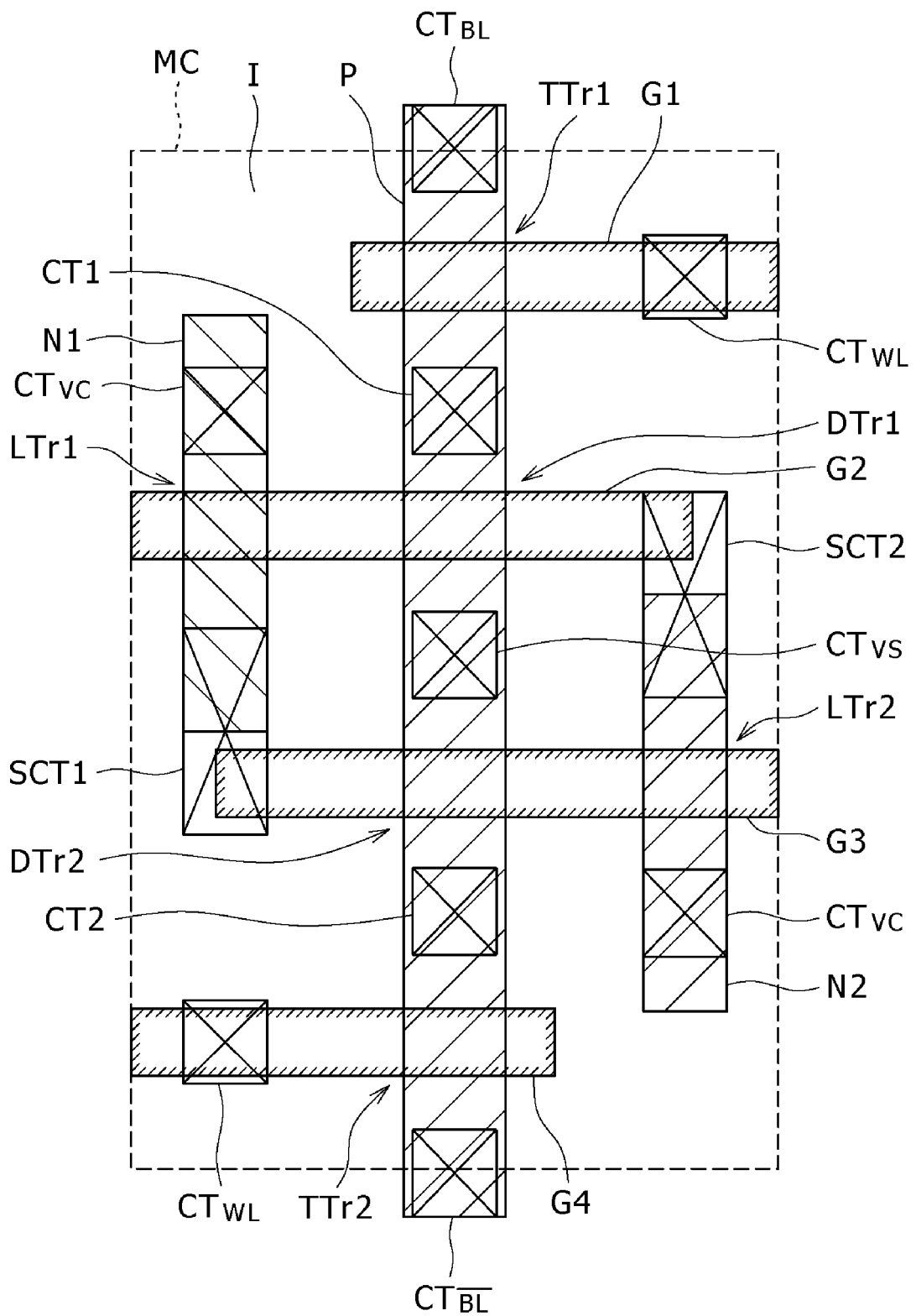
FIG. 2 is a top view showing the layout of components employed in each memory cell of the SRAM according to the first embodiment of the present invention.

FIG. 2 is a top view showing the layout of components employed in each memory cell MC of the SRAM according to the first embodiment of the present invention.

Typically, a P-type semiconductor area P serving as a first semiconductor area, an first N-type semiconductor area N1 serving as a second semiconductor area and a second N-type semiconductor area N2 serving as a third semiconductor area are formed on a semiconductor substrate as segments isolated from each other by a device isolating insulation film I. Each of the P-type semiconductor area P, the first N-type semiconductor area N1 and the second N-type semiconductor area N2 is typically configured as a well formed on the semiconductor substrate.

The memory cell MC has a layout in which the first transfer transistor TTr1, the first driver transistor DTr1, the second driver transistor DTr2, and the second transfer transistor TTr2, are arranged and connected in series in the P-type semiconductor area P (serving as the first semiconductor area) formed as a segment having the shape of a straight line on the semiconductor substrate. The first load transistor LTr1 is provided in the first N-type semiconductor area N1 (serving as the second semiconductor area) formed as a segment on the semiconductor substrate. The second load transistor LTr2 is provided in the second N-type semiconductor area N2 (serving as the third semiconductor area) formed as a segment on the semiconductor substrate. The first semiconductor area P is sandwiched by the second semiconductor area N1 and the third semiconductor area N2.

In the layout described above, a first gate electrode G1 is formed to cross the P-type semiconductor area P, a second gate electrode G2 is formed to cross the P-type semiconductor area P and the first N-type semiconductor area N1, a third gate electrode G3 is formed to cross the P-type semiconductor area P and the second N-type semiconductor area N2 whereas a fourth gate electrode G4 is formed to cross the P-type semiconductor area P. In addition, each source and drain area is formed on the surface of each semiconductor area excluding the area in which each gate electrode is formed.

Thus, typically, each of the second gate electrode G2 and the third gate electrode G3 is stretched in a direction perpendicular to the stretching direction of the P-type semiconductor area P (serving as the first semiconductor area) having the shape of a straight line. In this configuration, the second gate electrode G2 serves as a common gate electrode shared by the first driver transistor DTr1 and the first load transistor LTr1 whereas the third gate electrode G3 serves as a common gate electrode shared by the second driver transistor DTr2 and the second load transistor LTr2.

An opening is formed to start continuously from the source and drain area of the first load transistor LTr1 formed to operate as a PMOS transistor to an area covering the third gate electrode G3, and a common contact SCT1 is provided in the opening to connect the source and drain area of the first load transistor LTr1 to the third gate electrode G3. On the other hand, an opening is formed in the source and drain area connecting the first driver transistor DTr1 formed to operate as an NMOS transistor to the first transfer transistor TTr1 also formed to operate as an NMOS transistor, and a contact CT1 is provided in the opening. The contact CT1 is connected to the common contact SCT1 by an upper-layer wire not shown in the top view of FIG. 2 to form the first storage node ND in the equivalent circuit shown in the circuit diagram of FIG. 1.

By the same token, an opening is formed to start continuously from the source and drain area of the second load transistor LTr2 formed to operate as a PMOS transistor to an area covering the second gate electrode G2, and a common contact SCT2 is provided in the opening to connect the source and drain area of the second load transistor LTr2 to the second gate electrode G2. On the other hand, an opening is formed in the source and drain area connecting the second driver transistor DTr2 formed to operate as an NMOS transistor to the second transfer transistor TTr2 also formed to operate as an NMOS transistor, and a contact CT2 is provided in the opening. The contact CT2 is connected to the common contact SCT2 by an upper-layer wire not shown in the top view of FIG. 2 to form the second storage node ND/ in the equivalent circuit shown in the circuit diagram of FIG. 1.

In addition, a contact $CT_{WL}$ is formed as an opening for each of the first gate electrode G1 of the first transfer transistor TTr1 and the fourth gate electrode G4 of the second transfer transistor TTr2. Each of the first gate electrode G1 and the second gate electrode G4 are linked through the contact $CT_{WL}$ formed for them to an upper-layer wire which is connected to the word line WL.

On top of that, a contact $CT_{BL}$ is formed as an opening for the source and drain area included in the first transfer transistor TTr1 on a side opposite to the contact CT1. This source and drain area is linked through the contact $CT_{BL}$ to an upper-layer wire connected to the bit line BL. By the same token, another contact $CT_{BL}$ is formed as an opening for the source and drain area included in the second transfer transistor TTr2 on a side opposite to the contact CT2. This source and drain area is linked through this other contact $CT_{BL}$ to an upper-layer wire connected to a complementary-bit line BL/.

In addition, a contact $CT_{VS}$ is formed as an opening for source and drain areas connecting the first driver transistor DTr1 and the second driver transistor DTr2 to each other. The source and drain areas are linked through the contact $CT_{VS}$ to an upper-layer wire connected to the reference electric potential Vs.

On top of that, a contact $CT_{VC}$ is formed as an opening for the source and drain area included in the first load transistor LTr1 on a side opposite to the common contact SCT1. This source and drain area is linked through the contact $CT_{VC}$ to an upper-layer wire connected to the line conveying the power-supply voltage Vc. By the same token, another contact $CT_{VC}$ is formed as an opening for the source and drain area included in the second load transistor LTr2 on the side opposite to the common contact SCT2. This source and drain area is linked through this other contact $CT_{VC}$ to an upper-layer wire connected to the line conveying the power-supply voltage Vc.

The SRAM employs a plurality of memory cells MC each configured as described above to have a layout in which the first semiconductor area with the first driver transistor DTr1, the first transfer transistor TTr1, the second driver transistor DTr2 and the second transfer transistor TTr2 provided therein is sandwiched by the second semiconductor area N1 with the first load transistor LTr1 provided therein and the third semiconductor area N2 with the second load transistor LTr2 provided therein. As described later in detail, the layout can reduce the variation of transistor characteristic even if masks are shifted in the manufacturing process.

In the SRAM according to this embodiment, it is desirable to provide a configuration in which memory cells MC located at adjacent positions separated from each other in a direction perpendicular to the stretching direction of the P-type semiconductor area P (serving as the first semiconductor area) having the shape of a straight line have the same layout.

With such a configuration, even if the creation positions of masks MK are shifted in a manufacturing process, it is possible to reduce the number of variations in memory-cell characteristic from cell to cell as will be described later in detail.

In addition, in the SRAM according to this embodiment, the contact $CT_{VS}$ for linking the source and drain areas connecting the first driver transistor DTr1 and the second driver transistor DTr2 to each other to the reference electric potential Vs is implemented by a contact as shown in FIG. 2.

In the configuration according to the existing technology for example, the source and drain areas are linked through two contacts which are formed at locations separated from each other. Thus, if the contacts have contact resistances different from each other, the parasitic resistors R1 and R2 shown in the circuit diagram of FIG. 1 also have contact resistances different from each other. In consequence, the symmetry of the memory cell MC deteriorates, degrading the characteristics of the memory cell MC. In the case of the embodiment, however, the source and drain areas are linked through one contact as described above. Thus, the parasitic resistors R1 and R2 also have contact resistances equal to each other. As a result, the degradation of the memory-cell characteristics can be reduced.

Figure 3A:
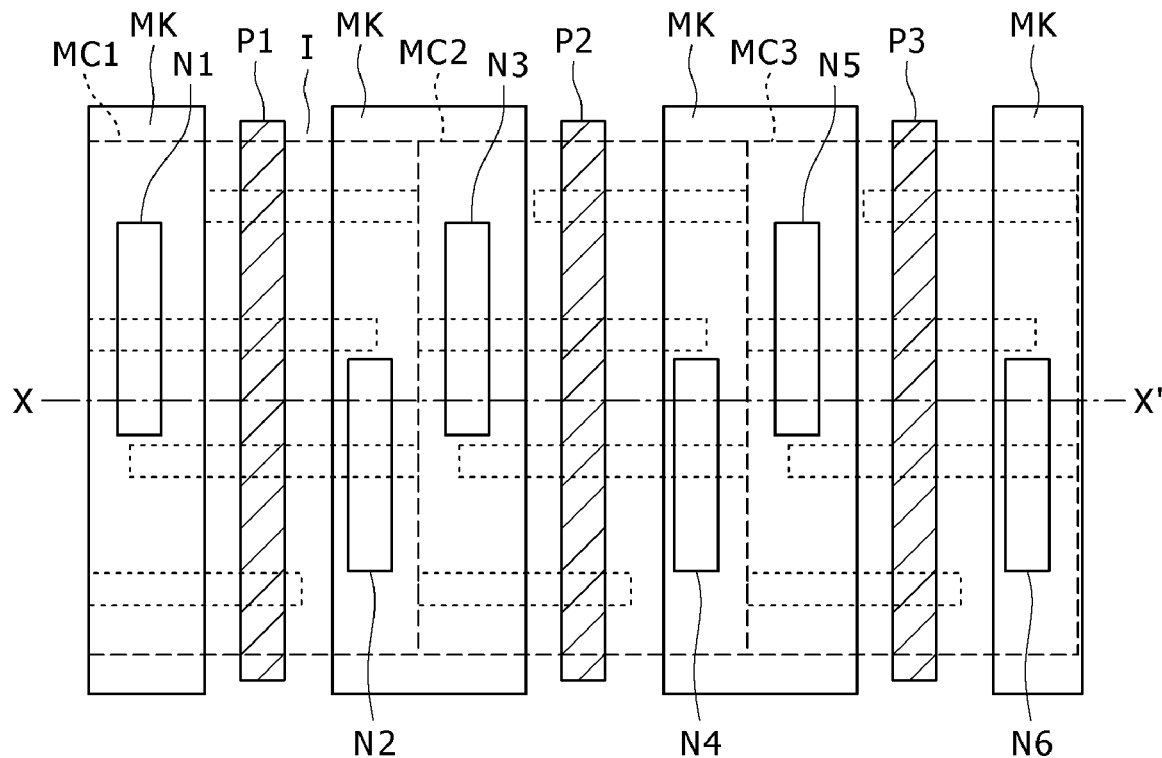
FIG. 3A is a top view showing components formed in accordance with a method for manufacturing an SRAM used as a semiconductor storage device in accordance with the first embodiment of the present invention, the method including a process to form a P-type semiconductor area serving as a first semiconductor area as a well on a semiconductor substrate.

Next, the following description explains the method for manufacturing the SRAM used as the semiconductor storage device in accordance with a first preferred embodiment of the present invention. FIG. 3A is a top view showing components formed in accordance with the method for manufacturing the SRAM having the above mentioned configuration of memory cells, including a process to form a P-type semiconductor area P serving as a first semiconductor area as a well on a semiconductor substrate 10. On the other hand, FIG. 3B is a cross-sectional diagram showing a model of the cross section of the components shown in FIG. 3A.

Figure 3B:
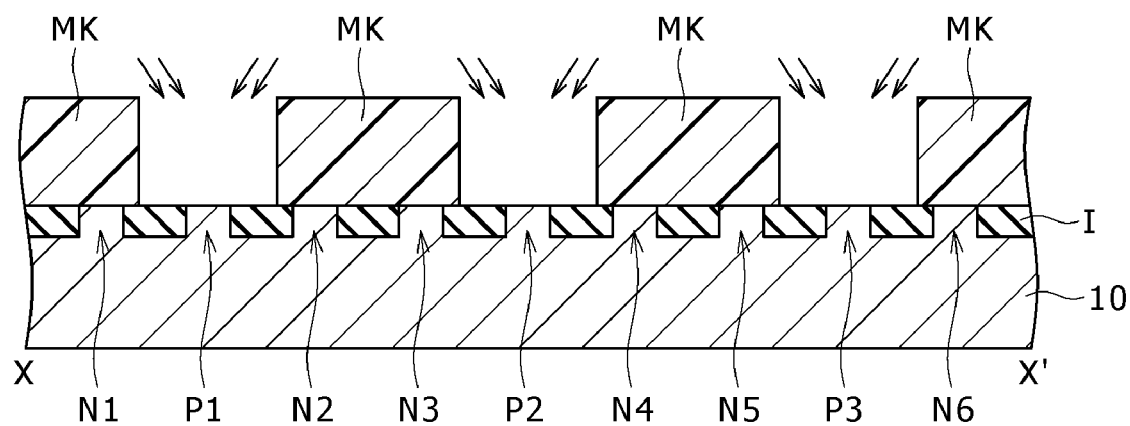
FIG. 3B is a cross-sectional diagram showing a model of the components shown in FIG. 3A.

FIGS. 3A and 3B show three memory cells MC1, MC2 and MC3. The area of the memory cell MC1 includes a P-type semiconductor area P1 used for forming NMOS transistors, a first N-type semiconductor area N1 used for forming a PMOS transistor and an second N-type semiconductor area N2 used for forming a PMOS transistor. By the same token, the area of the memory cell MC2 includes a P-type semiconductor area P2 used for forming NMOS transistors, a first N-type semiconductor area N3 used for forming a PMOS transistor and an second N-type semiconductor area N4 used for forming a PMOS transistor. In the same way, area of the memory cell MC3 includes a P-type semiconductor area P3 used for forming NMOS transistors, an first N-type semiconductor area N5 used for forming a PMOS transistor and an second N-type semiconductor area N6 used for forming a PMOS transistor.

First of all, typically, a device separating isolation film I is formed on the semiconductor substrate 10 to separate active segments from each other by adoption of the STI method as shown in the cross-sectional diagram of FIG. 3B.

Then, each of areas allocated to the P-type semiconductor areas P1, P2 and P3 is protected by a mask such as a resist film (the mask is not shown). Subsequently, ions each serving as an n-type conductive impurity are injected in an ion injection process to form the first N-type semiconductor areas N1, N3 and N5 as well as the second N-type semiconductor areas N2, N4 and N6.

Then, the first N-type semiconductor areas N1, N3 and N5 as well as the second N-type semiconductor areas N2, N4 and N6 are protected by masks MK such as a resist film as shown in FIGS. 3A and 3B. Subsequently, ions each serving as a p-type conductive impurity are injected in an ion injection process to form the P-type semiconductor areas P1, P2 and P3.

Ions each serving as a conductive impurity are injected in the ion-injection processes described above in a direction forming an angle relative to the surface of the semiconductor substrate 10.

Let us think of a case in which the creation positions of the formed masks MK for protecting the first N-type semiconductor areas N1, N3 and N5 as well as the second N-type semiconductor areas N2, N4 and N6 are inadvertently shifted in the process of forming the P-type semiconductor areas P1, P2 and P3.

Figure 4A:
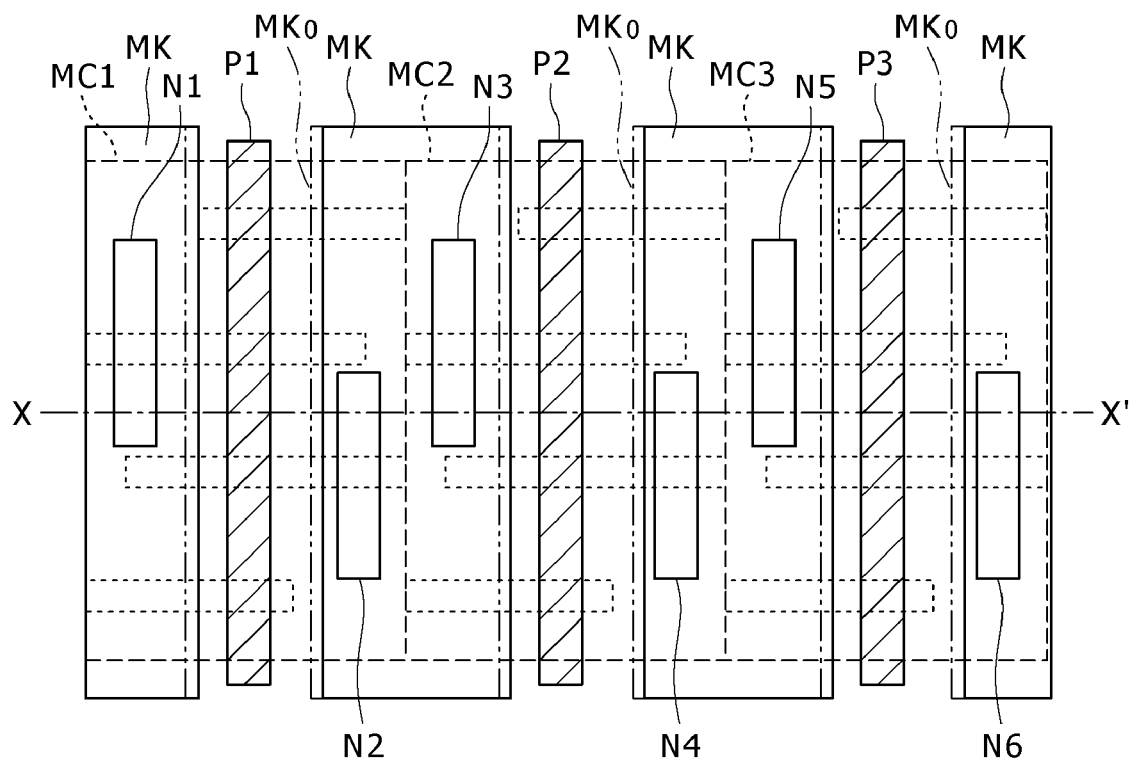
FIG. 4A is a top view to be referred to in description of a process of forming P-type semiconductor areas on the semiconductor substrate in accordance with the first embodiment of the present invention as a well.
Figure 4B:
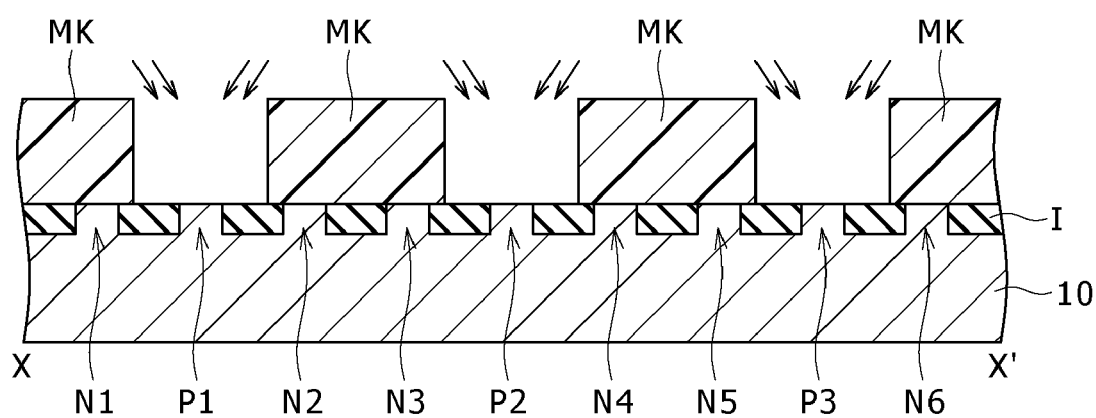
FIG. 4B is a cross-sectional diagram showing a model of the P-type semiconductor areas shown in FIG. 4A.

FIG. 4A is a top view showing the P-type semiconductor areas P1, P2 and P3 in the process to form each of them on the semiconductor substrate 10 as a well. The creation position of each of the masks MK is undesirably shifted from its supposed position $MK_0$ to the right direction in the top view of FIG. 4. FIG. 4B is a cross-sectional diagram showing the cross section of a model of the P-type semiconductor areas P1, P2 and P3 shown in FIG. 4A.

Figure 12:
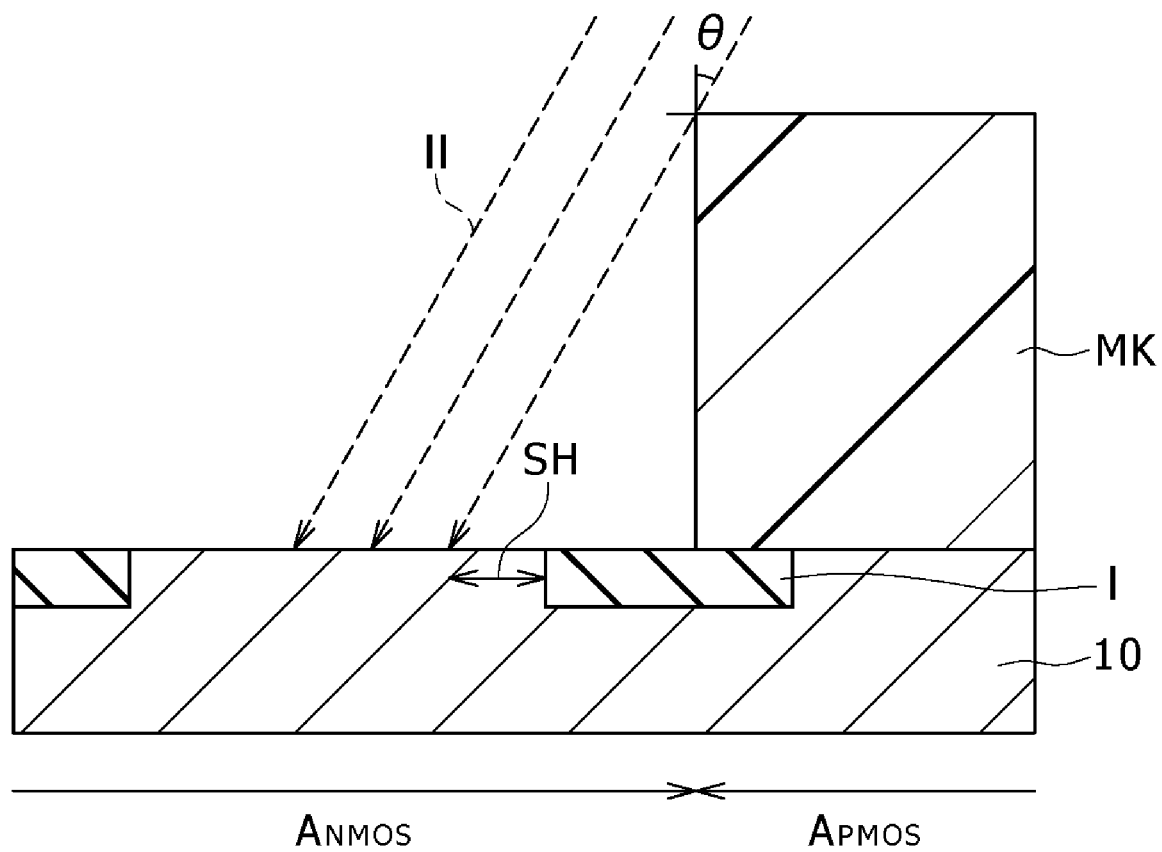
FIG. 12 is a model cross-sectional diagram to be referred to in description of problems raised by the existing technology.

In this case, each of the masks MK becomes closer to one of the P-type semiconductor areas P1, P2 and P3. If ions each serving as an impurity are injected in an inclined direction onto the surface of a P-type semiconductor area P in an ion injection process from a position above the surface on the side approached by the mask MK for the P-type semiconductor area P as shown in FIG. 12, an area SH on which a shadow is cast by the mask MK is not subjected to a process to inject adequate ions. In the layout of each memory cell MC employed in the SRAM according to the embodiment, however, shadows each cast by a mask MK for a memory cell MC result in areas SH in respectively the first and second driver transistors DTr1 and DTr2 of the same memory sell MC or the first and second transfer transistors TTr1 and TTr2 of the same memory sell MC as shadowed areas having equal sizes. Thus, even if each of the areas SH is not subjected to a process to inject adequate ions, the first and second driver transistors DTr1 and DTr2 of the same memory sell MC or the first and second transfer transistors TTr1 and TTr2 of the same memory sell MC have characteristics essentially identical with each other. That is to say, transistors forming a pair in the same memory cell MC can be sustained in a state of having characteristics essentially identical with each other. As a result, it is possible to prevent the characteristics of the SRAM from deteriorating. As described before, the characteristics of the SRAM include a characteristic to write data into memory cell MC in the SRAM, a characteristic to hold the written data in the memory cell MC and a characteristic to read out the data held in the memory cell MC from the memory cell MC.

Then, a process is typically carried out to form gate insulation films composing the first driver transistor DTr1, the first load transistor LTr1, the first transfer transistor TTr1, the second driver transistor DTr2, the second load transistor LTr2 and the second transfer transistor TTr2 in the P-type semiconductor areas P1, P2 and P3, the first N-type semiconductor areas N1, N3 and N5 as well as the second N-type semiconductor areas N2, N4 and N6 by adoption of a thermal oxidation method or a CVD (Chemical Vapor Deposition) method. The gate insulation films themselves are not shown in FIGS. 3A to 4B.

Subsequently, a conductive layer is formed by depositing poly-silicon over the entire surface by adoption of the CVD method. Then, a resist film not shown in the diagrams of FIGS. 3A to 4B is formed to serve as a film for protecting the pattern of the gate electrode of every transistor. Subsequently, the resist film is subjected to an etching process to fabricate conductive layers and gate insulation films into the patterns of the first gate electrode G1, the second gate electrode G2, the third gate electrode G3 and the fourth gate electrode G4 on the layout shown in FIG. 2 in order to form the gate electrodes G1, G2, G3 and G4 of the first transfer transistor TTr1, first driver transistor DTr1, the second driver transistor DTr2 and the second transfer transistor TTr2 respectively in each of the P-type semiconductor areas P1, P2 and P3, the gate electrode G2 of the first load transistor LTr1 in each of the first N-type semiconductor areas N1, N3 and N5 as well as the gate electrode G3 of the second load transistor LTr2 in each of the first N-type semiconductor areas N2, N4 and N6.

Thus, the second gate electrode G2 of the first load transistor LTr1 is shared with the first driver transistor DTr1 as a gate electrode common to the first load transistor LTr1 and the first driver transistor DTr1 as is obvious from the above description. For this reason, the second gate electrode G2 is extended in a direction perpendicular to a direction in which each of the P-type semiconductor areas P1, P2 and P3 having the shape of a straight line is stretched. By the same token, the third gate electrode G3 of the second load transistor LTr2 is shared with the second driver transistor DTr2 as a gate electrode common to the second load transistor LTr2 and the second driver transistor DTr2 as is obvious from the above description. For this reason, the third gate electrode G3 is extended in a direction perpendicular to a direction in which each of the P-type semiconductor areas P1, P2 and P3 having the shape of a straight line is stretched.

Then, by making use of each of the gate electrodes G1, G2, G3 and G4 as a mask, conductive impurities are injected in an ion injection process into each of the P-type semiconductor areas P1, P2 and P3 in order to form the first transfer transistor TTr1, first driver transistor DTr1, the second driver transistor DTr2 and the second transfer transistor TTr2 in each of the P-type semiconductor areas P1, P2 and P3, into each of the first N-type semiconductor areas N1, N3 and N5 in order to form the first load transistor LTr1 in each of the first N-type semiconductor areas N1, N3 and N5 and into each of the second N-type semiconductor areas N2, N4 and N6 in order to form the second load transistor LTr2 in each of the first N-type semiconductor areas N2, N4 and N6.

In this ion injection process, a side-wall spacer can be formed in advance on each of side portions of every gate electrode and, by injecting ions into areas sandwiching one of the formed side-wall spacers, each of the areas each doped with the injected ions can be used as a source and drain area having an extension area.

Next, an inter-layer insulation film is formed by depositing silicon oxide over the entire surface by adoption of the CVD method and a contact hole reaching the source and drain area of every transistor is formed as an opening. In particular, an opening is formed to start continuously from the source and drain area of the first load transistor LTr1 to an area covering the third gate electrode G3, and a common contact SCT1 is provided in the opening to connect the source and drain area of the first load transistor LTr1 to the third gate electrode G3. By the same token, an opening is formed to start continuously from the source and drain area of the second load transistor LTr2 to an area covering the second gate electrode G2, and common contact SCT2 is provided in the opening to connect the source and drain area of the second load transistor LTr2 to the second gate electrode G2.

Then, a conductive layer is typically embedded in the contact hole which has been formed as an opening in order to form an upper-layer wire.

By carrying out the processes described above, it is possible to manufacture each memory cell MC employed in an SRAM as a memory cell MC having a layout shown in FIG. 2.

In accordance with the method for manufacturing an SRAM to serve as a semiconductor storage device according to the embodiment, in a process of forming a P-type semiconductor area P, the creation position of each of masks MK for protecting the first N-type areas N1, N3 and N5 as well as the second N-type areas N2, N4 and N6 may be inadvertently shifted so that there is generated an area, the process to inject adequate ions onto which cannot be carried out. Even if the process to inject adequate ions onto such a generated area cannot be carried out, however, the first and second driver transistors DTr1 and DTr2 of the same memory sell MC or the first and second transfer transistors TTr1 and TTr2 of the same memory sell MC have characteristics essentially identical with each other. That is to say, transistors forming a pair in the same memory cell MC can be sustained in a state of having characteristics essentially identical with each other. As a result, it is possible to prevent the characteristics of the SRAM from deteriorating. As described before, the characteristics of the SRAM include a characteristic to write data into memory cell MC in the SRAM, a characteristic to hold the written data in the memory cell MC and a characteristic to read out the data held in the memory cell MC from the memory cell MC.

In accordance with the method for manufacturing an SRAM to serve as a semiconductor storage device according to the embodiment, it is desirable to provide a configuration in which memory cells MC located at adjacent positions separated from each other in a direction perpendicular to the stretching direction of the P-type semiconductor area P (serving as the first semiconductor area) having the shape of a straight line have the same layout. That is to say, as shown in FIGS. 3A and 4A, the memory cells MC1 to MC3 located at adjacent positions separated from each other in such a direction have the same layout.

Figure 5:
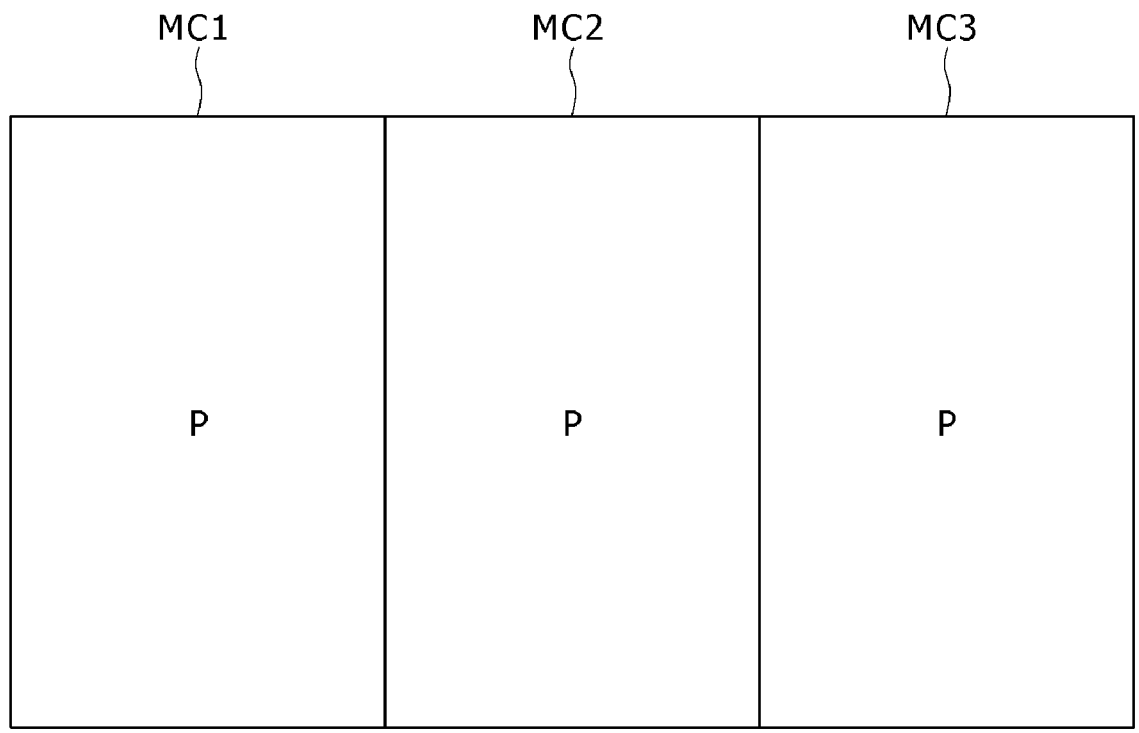
FIG. 5 is an explanatory diagram showing a model of a configuration of the adjacent memory cells according to the first embodiment of the present invention.

FIG. 5 is an explanatory diagram showing a model of a configuration of the adjacent memory cells MC1, MC2 and MC3 described above as memory cells MC according to the first embodiment of the present invention. The memory cells MC1 to MC3 are located at adjacent positions separated from each other in a direction perpendicular to the stretching direction of the P-type semiconductor area P (serving as the first semiconductor area) having the shape of a straight line.

As described above, the memory cells MC1, MC2 and MC3 located at adjacent positions separated from each other have the same layout pattern in place of mutually inverted layout patterns or rotationally symmetrical layout patterns.

Thus, a transistor-characteristic deterioration caused by shifted creation positions generated in a manufacturing process as shifted creation positions of masks MK is resulted in uniformly in all memory cells MC. As a result, it is possible to prevent the characteristics of the SRAM from deteriorating. As described before, the characteristics of the SRAM include a characteristic to write data into memory cell MC in the SRAM, a characteristic to hold the written data in the memory cell MC and a characteristic to read out the data held in the memory cell MC from the memory cell MC.

Second Embodiment

Figure 6:
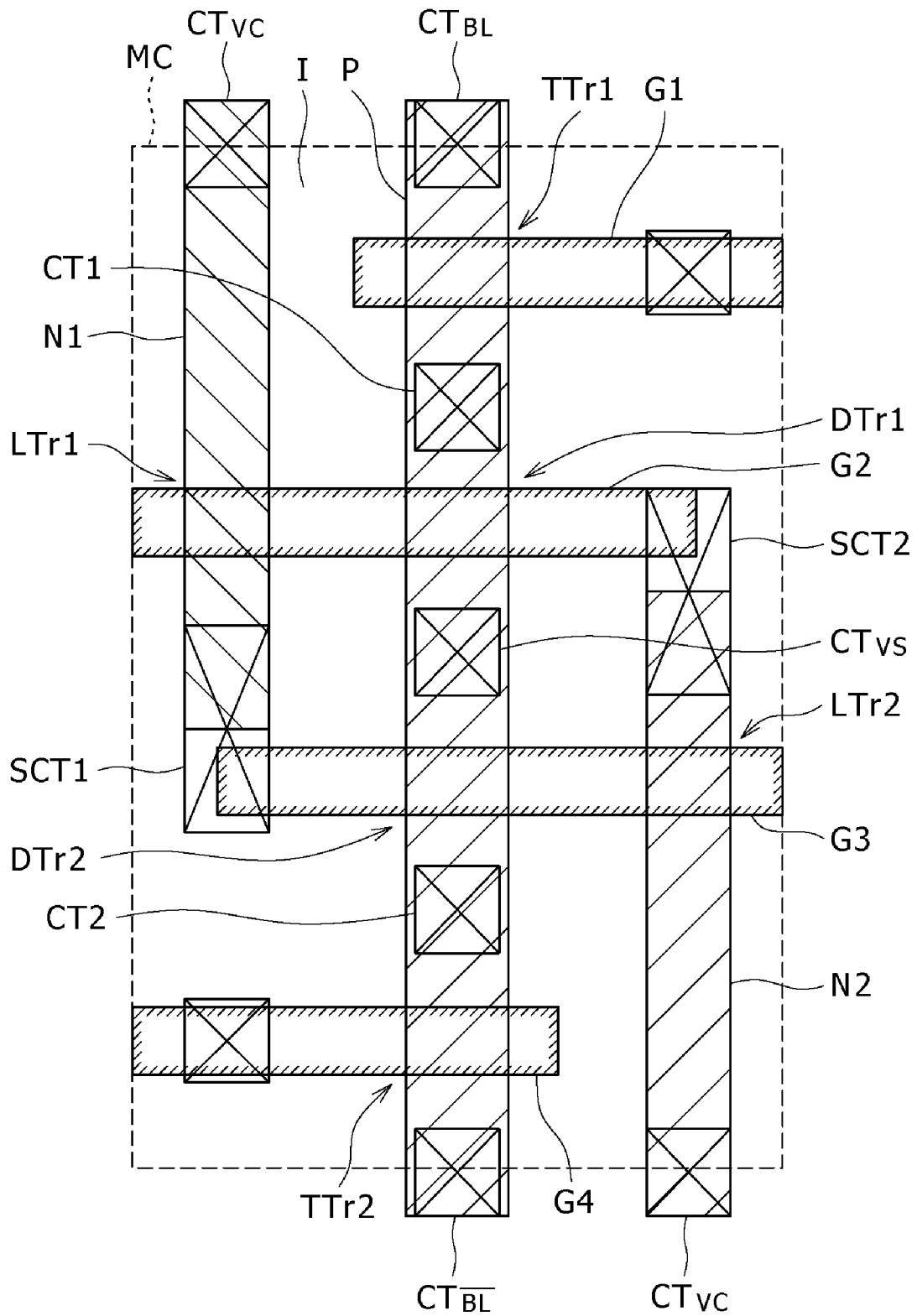
FIG. 6 is a top view showing the layout of a memory cell employed in an SRAM according to a second embodiment of the present invention.

FIG. 6 is a top view showing the layout of a memory cell MC employed in an SRAM according to a second embodiment of the present invention.

In the same way as the first embodiment, also in the case of the second embodiment, a P-type semiconductor area P serving as a first semiconductor area, an first N-type semiconductor area N1 serving as a second semiconductor area and an second N-type semiconductor area N2 serving as a third semiconductor area are formed on a semiconductor substrate as segments isolated from each other by a device isolating insulation film I. Each of the P-type semiconductor area P, the first N-type semiconductor area N1 and the second N-type semiconductor area N2 is typically configured as a well formed on the semiconductor substrate.

The memory cell MC has a layout in which the first transfer transistor TTr1, the first driver transistor DTr1, the second driver transistor DTr2, and the second transfer transistor TTr2, are arranged and connected in series in the P-type semiconductor area P (serving as the first semiconductor area) formed as a segment having the shape of a straight line on the semiconductor substrate. The first load transistor LTr1 is provided in the first N-type semiconductor area N1 (serving as the second semiconductor area) formed as a segment on the semiconductor substrate. The second load transistor LTr2 is provided in the second N-type semiconductor area N2 (serving as the third semiconductor area) formed as a segment on the semiconductor substrate. The first semiconductor area P is sandwiched by the second semiconductor area N1 and the third semiconductor area N2.

In the case of the second embodiment, unlike the first embodiment, each of terminal portions each used for forming a contact $CT_{VC}$ supplying a power-supply voltage of the first N-type semiconductor area N1 serving as a second semiconductor area or the second N-type semiconductor area N2 serving as a third semiconductor area in any particular one of the memory cells MC is stretched to reach an adjacent memory cell MC in the direction of the extension of the P-type semiconductor area P provided with the shape of a straight line to serve as a first semiconductor area; however, the contact $CT_{VC}$ for supplying the power-supply voltage to the first load transistor LTr1 formed in the first N-type semiconductor area N1 or the second load transistor LTr2 formed in the second N-type semiconductor area N2 is provided on the boundary between the particular memory cell MC and the adjacent memory cell MC separated away from the particular memory cell MC in the direction to serve as a common contact shared by the particular memory cell MC and the adjacent memory cell MC.

In the same way as the first embodiment, in the SRAM provided by the second embodiment as an SRAM employing memory cells MC each having the configuration described above, each of the memory cells MC has a layout in which the second semiconductor area with the first load transistor provided therein and the third semiconductor area with the second load transistor provided therein sandwich the first semiconductor area in which the first driver transistor, the first transfer transistor, the second driver transistor and the second transfer transistor are formed. Thus, even if the creation positions of masks MK are shifted in a manufacturing process, it is possible to reduce the number of characteristic variations from transistor to transistor.

In accordance with a method for manufacturing the SRAM according to the second embodiment, in a process of forming the first N-type semiconductor area N1 serving as a second semiconductor area or the second N-type semiconductor area N2 serving as a third semiconductor area, each of terminal portions each used for forming a contact $CT_{VC}$ supplying a power-supply voltage of the first N-type semiconductor area N1 serving as a second semiconductor area or the second N-type semiconductor area N2 serving as a third semiconductor area is stretched to reach an adjacent memory cell MC in the direction of the extension of the P-type semiconductor area P provided with the shape of a straight line to serve as a first semiconductor area, and the contact $CT_{VC}$ for supplying the power-supply voltage to the first load transistor LTr1 or the second load transistor LTr2 is provided on the boundary to be shared between the adjacent memory cells MC in the direction of the extension of the P-type semiconductor area P provided with the shape of a straight line to serve as a first semiconductor area.

Except for the processes described above, the method for manufacturing the SRAM according to the second embodiment is identical with the method for manufacturing the SRAM according to the first embodiment.

Much like the first embodiment, in accordance with the method for manufacturing an SRAM to serve as a semiconductor storage device according to the second embodiment, in a process of forming the P-type semiconductor area P, the creation position of each of masks MK for protecting the first N-type areas N1, N3 and N5 as well as the second N-type areas N2, N4 and N6 may be inadvertently shifted so that there is generated an area, the process to inject adequate ions onto which cannot be carried out. Even if the process to inject adequate ions onto such a generated area cannot be carried out, however, the first and second driver transistors DTr1 and DTr2 of the same memory sell MC or the first and second transfer transistors TTr1 and TTr2 of the same memory sell MC have characteristics essentially identical with each other. That is to say, transistors forming a pair in the same memory cell MC can be sustained in a state of having characteristics essentially identical with each other. As a result, it is possible to prevent the characteristics of the SRAM from deteriorating. As described before, the characteristics of the SRAM include a characteristic to write data into memory cell MC in the SRAM, a characteristic to hold the written data in the memory cell MC and a characteristic to read out the data held in the memory cell MC from the memory cell MC.

In accordance with the method for manufacturing an SRAM to serve as a semiconductor storage device according to the second embodiment, it is also desirable to provide a configuration in which memory cells MC located at adjacent positions separated from each other in a direction perpendicular to the stretching direction of the P-type semiconductor area P (serving as the first semiconductor area) having the shape of a straight line have the same layout.

Also in the case of the second embodiment, it is also desirable to provide a configuration in which memory cells MC located at adjacent positions separated from each other in a direction perpendicular to the stretching direction of the P-type semiconductor area P (serving as the first semiconductor area) having the shape of a straight line have the same layout pattern in place of mutually inverted layout patterns or rotationally symmetrical layout patterns. Thus, even if the process to inject adequate ions onto such a generated area cannot be carried out, it is possible to reduce the number of variations in RAM characteristics from cell to cell. As described before, the characteristics of the SRAM include a characteristic to write data into memory cell MC in the SRAM, a characteristic to hold the written data in the memory cell MC and a characteristic to read out the data held in the memory cell MC from the memory cell MC.

Third Embodiment

Figure 7:
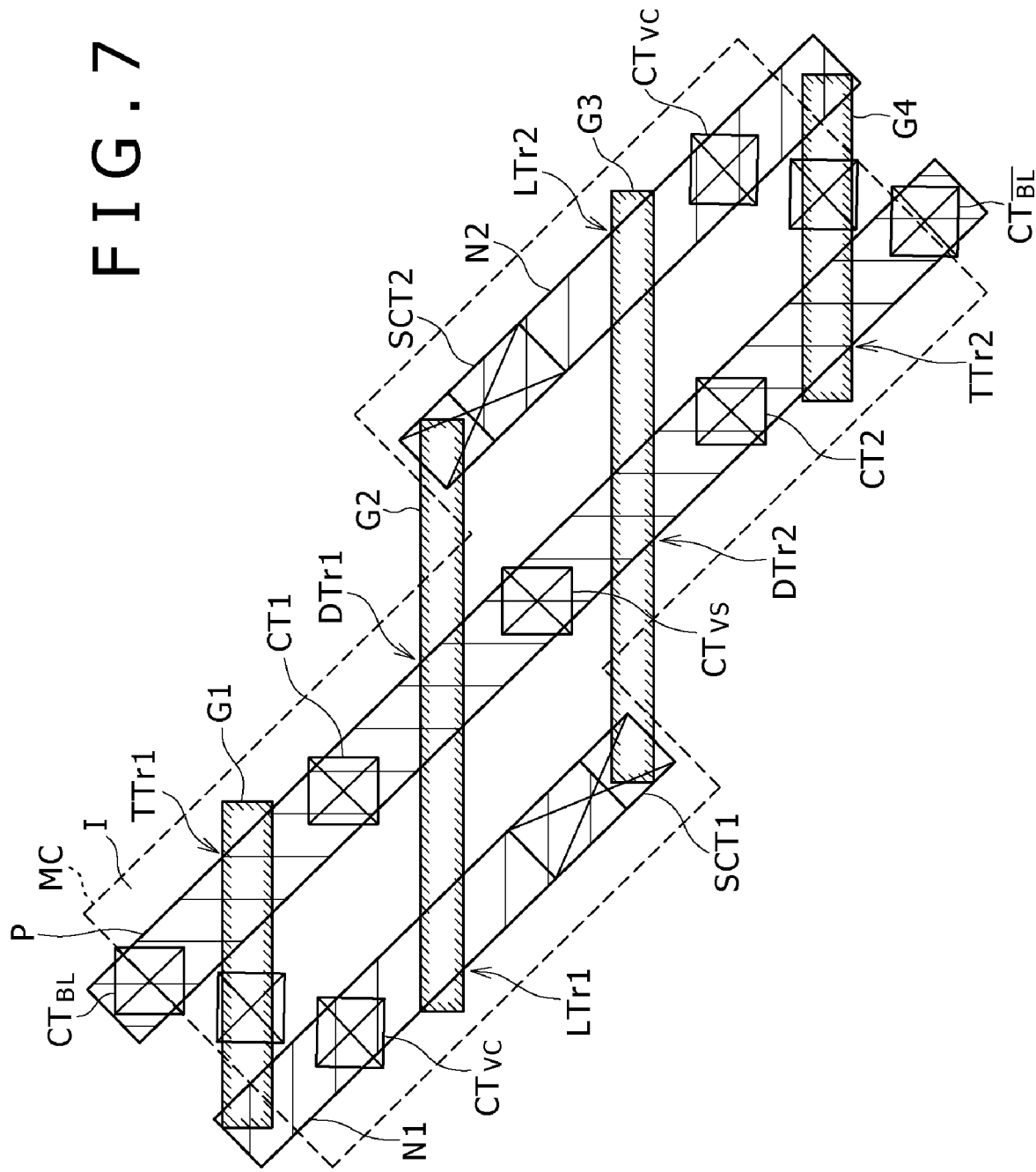
FIG. 7 is a top view showing the layout of a memory cell employed in an SRAM according to a third embodiment of the present invention.

FIG. 7 is a top view showing the layout of a memory cell MC employed in an SRAM according to a third embodiment of the present invention.

In the same way as the first embodiment, also in the case of the third embodiment, a P-type semiconductor area P serving as a first semiconductor area, an first N-type semiconductor area N1 serving as a second semiconductor area and an second N-type semiconductor area N2 serving as a third semiconductor area are formed on a semiconductor substrate as segments isolated from each other by a device isolating insulation film I. Each of the P-type semiconductor area P, the first N-type semiconductor area N1 and the second N-type semiconductor area N2 is typically configured as a well formed on the semiconductor substrate.

The memory cell MC has a layout in which the first transfer transistor TTr1, the first driver transistor DTr1, the second driver transistor DTr2, and the second transfer transistor TTr2, are arranged and connected in series in the P-type semiconductor area P (serving as the first semiconductor area) formed as a segment having the shape of a straight line on the semiconductor substrate. The first load transistor LTr1 is provided in the first N-type semiconductor area N1 (serving as the second semiconductor area) formed as a segment on the semiconductor substrate. The second load transistor LTr2 is provided in the second N-type semiconductor area N2 (serving as the third semiconductor area) formed as a segment on the semiconductor substrate. The first semiconductor area P is sandwiched by the second semiconductor area N1 and the third semiconductor area N2.

Unlike the first embodiment, however, in the case of the third embodiment, every memory cell MC has a layout in which each of the stretching direction of the first gate electrode G1 of the first transfer transistor TTr1, the stretching direction of the second gate electrode G2 shared by the first load transistor LTr1 and the first driver transistor DTr1, the stretching direction of the third gate electrode G2 shared by the second load transistor LTr2 and the second driver transistor DTr2 and the stretching direction of the fourth gate electrode G4 of the second transfer transistor TTr2 crosses the stretching direction of the P-type semiconductor area P (serving as the first semiconductor area) having the shape of a straight line, forming an angle greater than 45 degrees in conjunction with the stretching direction of the P-type semiconductor area P.

Figure 8:
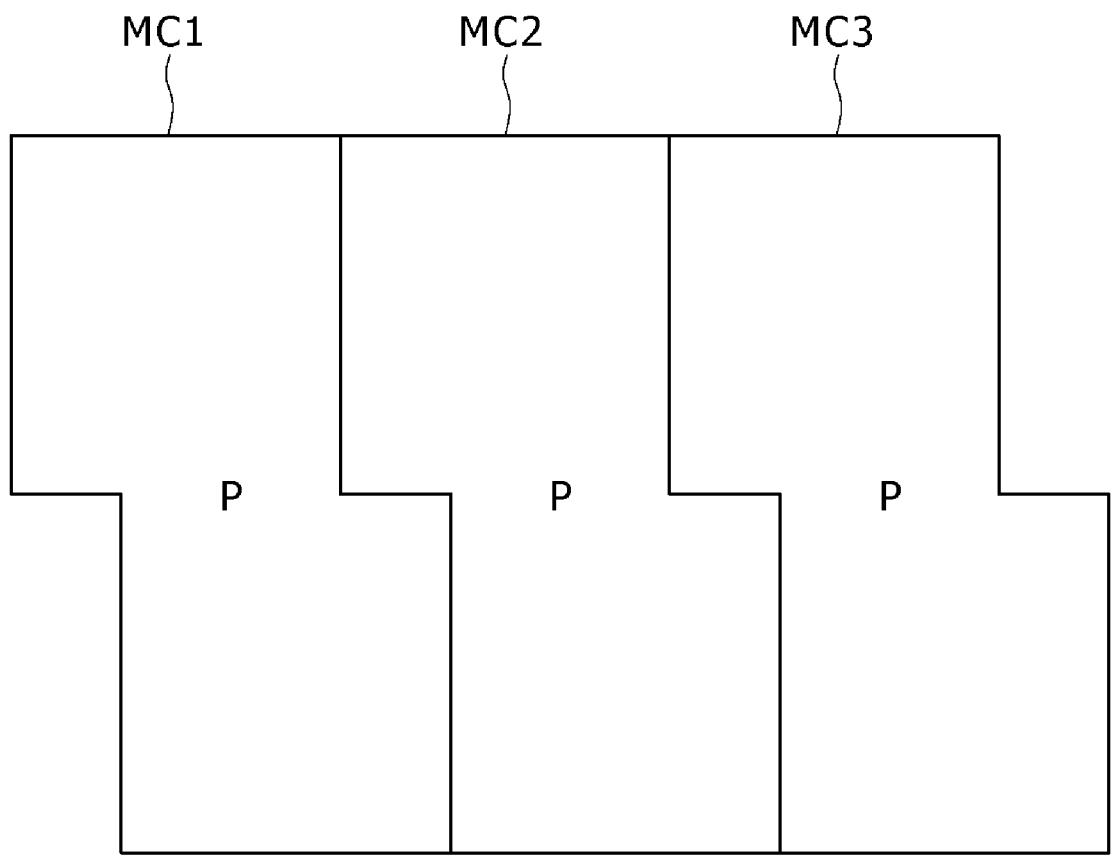
FIG. 8 is an explanatory diagram showing a model of a plurality of adjacently integrated memory cells each having a layout according to the third embodiment of the present invention.
Figure 9A:
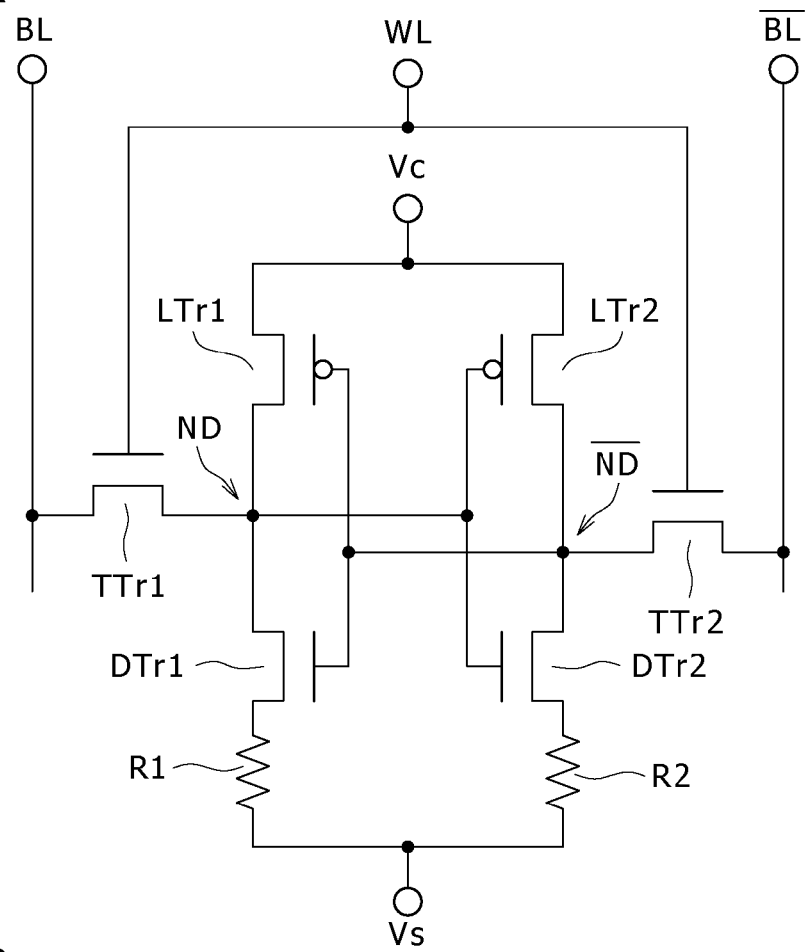
FIG. 9A is a circuit diagram showing an equivalent circuit of an SRAM memory cell employing six MOSFETs according to an existing technology.
Figure 9B:
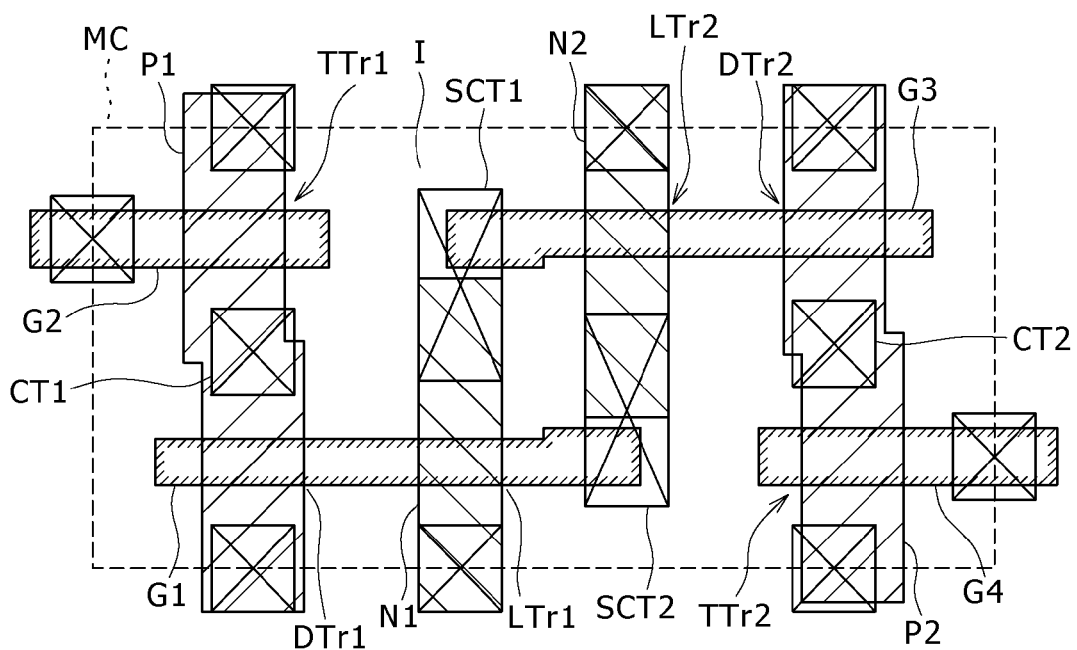
FIG. 9B is a top view showing a layout of the components composing the SRAM memory cell according to the existing technology shown in FIG. 9A.
Figure 10A:
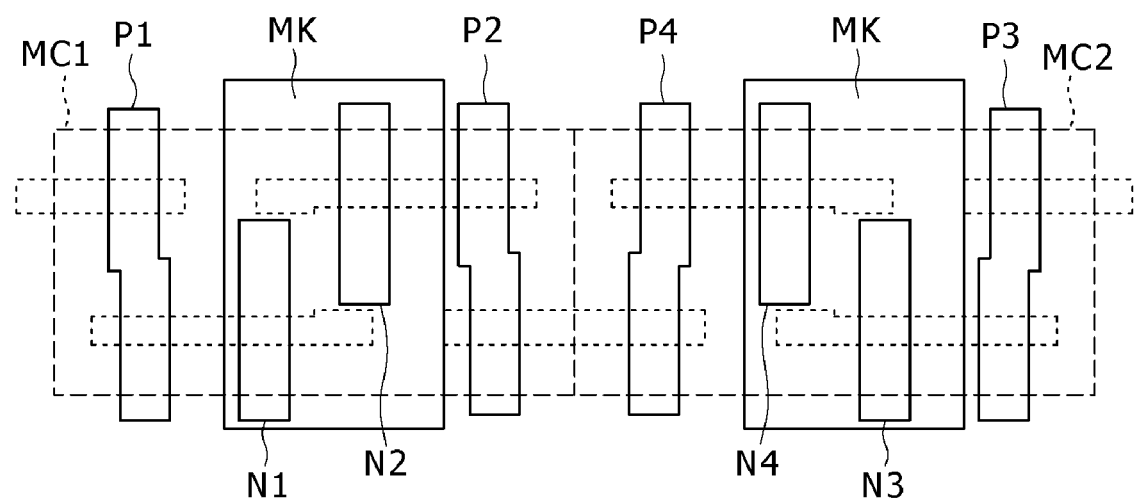
FIG. 10A is a top view showing first N-type semiconductor areas, second N-type semiconductor areas, first P-type semiconductor areas as well as second P-type semiconductor areas in a process to form each of the areas as a well on a semiconductor substrate by adoption of a method of manufacturing an SRAM employing memory cells according to the existing technology.
Figure 10B:
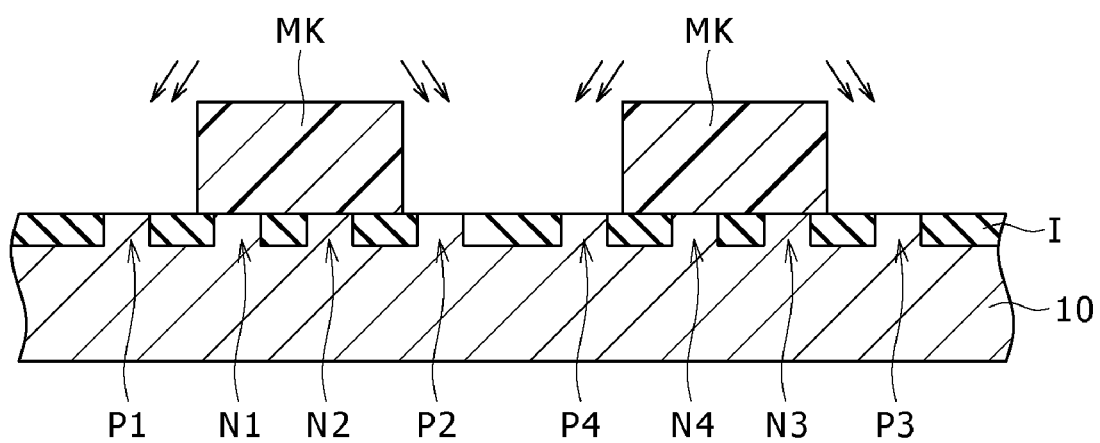
FIG. 10B is a cross-sectional diagram showing a model of the semiconductor areas shown in FIG. 10A.
Figure 11A:
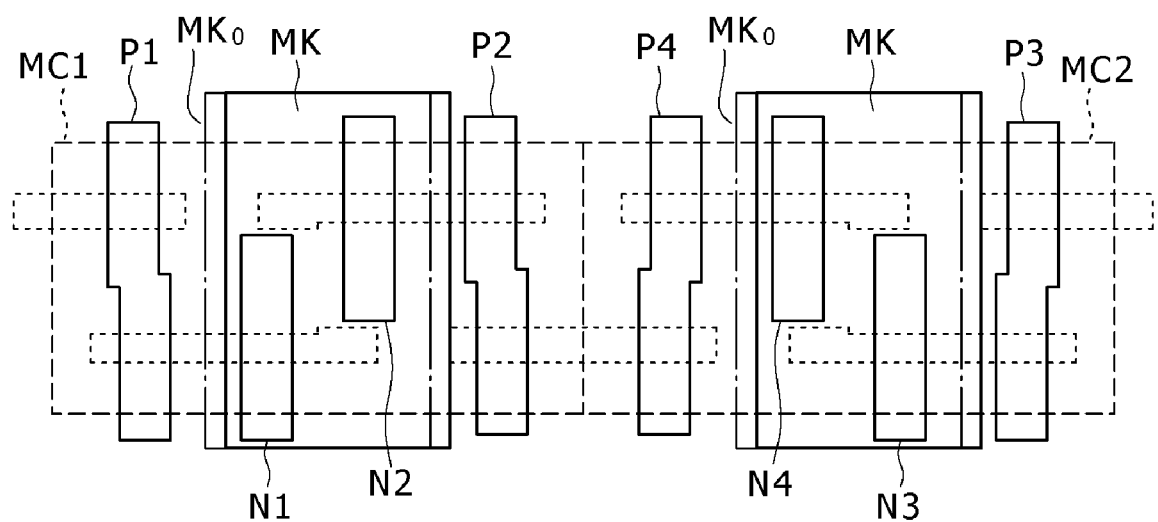
FIG. 11A is a top view showing the first P-type semiconductor areas as well as the second P-type semiconductor areas in a process to form each of the first P-type semiconductor areas as well as the second P-type semiconductor areas on the semiconductor substrate as a well in accordance with the existing technology.
Figure 11B:
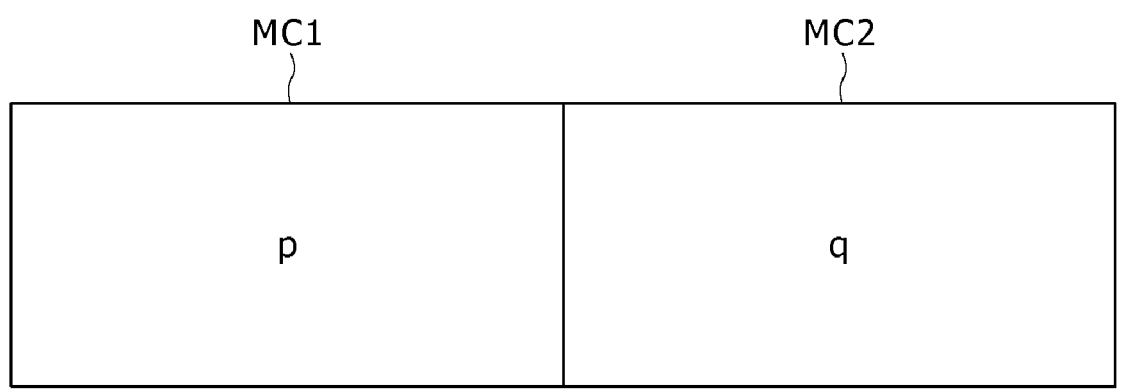
FIG. 11B is a top view showing a relation between the layout patterns of memory cells adjacent to each other.

FIG. 8 is an explanatory diagram showing a model of a plurality of adjacently integrated memory cells MC each having the layout described above as a layout according to the third embodiment of the present invention.

In the layout according to the third embodiment, every memory cell MC occupies an area obtained by cutting off portions from a square area. As shown in the explanatory model diagram of FIG. 8, a portion cut off from the square area of a specific memory cell MC is filled up with a protrusion of a memory cell MC adjacent to the specific memory cell MC, leaving no gap between the specific and adjacent memory cells MC.

In the same way as the first embodiment, in the SRAM provided by the third embodiment as an SRAM employing memory cells MC each having the configuration described above, each of the memory cells MC has a layout in which the second semiconductor area with the first load transistor provided therein and the third semiconductor area with the second load transistor provided therein sandwich the first semiconductor area in which the first driver transistor, the first transfer transistor, the second driver transistor and the second transfer transistor are formed. Thus, even if the creation positions of masks MK are shifted in a manufacturing process, it is possible to reduce the number of characteristic variations from transistor to transistor.

In accordance with the method for manufacturing an SRAM to serve as a semiconductor storage device according to the third embodiment, every memory cell MC is formed to have a layout in which each of the stretching direction of the first gate electrode G1 of the first transfer transistor TTr1, the stretching direction of the second gate electrode G2 shared by the first load transistor LTr1 and the first driver transistor DTr1, the stretching direction of the third gate electrode G3 shared by the second load transistor LTr2 and the second driver transistor DTr2 and the stretching direction of the fourth gate electrode G4 of the second transfer transistor TTr2 crosses the stretching direction of the P-type semiconductor area P (serving as the first semiconductor area) having the shape of a straight line, forming an angle greater than 45 degrees in conjunction with the stretching direction of the P-type semiconductor area P.

Except for the process described above, the method for manufacturing the SRAM according to the third embodiment is identical with the method for manufacturing the SRAM according to the first embodiment.

Much like the first embodiment, in accordance with the method for manufacturing an SRAM to serve as a semiconductor storage device according to the third embodiment, in a process of forming the P-type semiconductor area P, the creation position of each of masks MK for protecting the first N-type areas N1, N3 and N5 as well as the second N-type areas N2, N4 and N6 may be inadvertently shifted so that there is generated an area, the process to inject adequate ions onto which cannot be carried out. Even if the process to inject adequate ions onto such a generated area cannot be carried out, however, the first and second driver transistors DTr1 and DTr2 of the same memory sell MC or the first and second transfer transistors TTr1 and TTr2 of the same memory sell MC have characteristics essentially identical with each other. That is to say, transistors forming a pair in the same memory cell MC can be sustained in a state of having characteristics essentially identical with each other. As a result, it is possible to prevent the characteristics of the SRAM from deteriorating. As described before, the characteristics of the SRAM include a characteristic to write data into memory cell MC in the SRAM, a characteristic to hold the written data in the memory cell MC and a characteristic to read out the data held in the memory cell MC from the memory cell MC.

In accordance with the method for manufacturing an SRAM to serve as a semiconductor storage device according to the third embodiment, it is also desirable to provide a configuration in which memory cells MC located at adjacent positions separated from each other in a direction forming an angle greater than 45 degrees in conjunction with the stretching direction of the P-type semiconductor area P (serving as the first semiconductor area) having the shape of a straight line have the same layout as shown in the explanatory model diagram of FIG. 8.

Also in the case of the third embodiment, it is also desirable to provide a configuration in which memory cells MC located at adjacent positions separated from each other in a direction forming an angle greater than 45 degrees in conjunction with the stretching direction of the P-type semiconductor area P (serving as the first semiconductor area) having the shape of a straight line have the same layout pattern in place of mutually inverted layout patterns or rotationally symmetrical layout patterns. Thus, even if the process to inject adequate ions onto such a generated area cannot be carried out, it is possible to reduce the number of variations in RAM characteristics from MC (memory cell) to MC. As described before, the characteristics of the SRAM include a characteristic to write data into memory cell MC in the SRAM, a characteristic to hold the written data in the memory cell MC and a characteristic to read out the data held in the memory cell MC from the memory cell MC.

The scope of the present invention is by no means limited to the embodiments described above. For example, even though each of the embodiments implements an SRAM employing memory cells MC each having six transistors, the present invention can also be applied to the so-called dual-port SRAM employing memory cells MC each having eight or ten transistors.

In addition, each of the embodiments can be changed arbitrarily to provide a variety of modified versions as long as the versions fall within a range not deviating from essentials of the present invention.

The semiconductor storage device provided by the present invention can be applied to an SRAM employing a plurality of memory cells MC each including typically six MOSFETS.

The method for manufacturing the semiconductor storage device provided by the present invention can be applied to a method for manufacturing an SRAM employing a plurality of memory cells MC each including typically six MOSFETS.

It should be understood by those skilled in the art that a variety of modifications, combinations, sub-combinations and alterations may occur, depending on design requirements and other factors as far as they are within the scope of the appended claims or the equivalents thereof.

What is claimed is:

1. A semiconductor storage device including a plurality of integrated memory cells each comprising:
   a first inverter having a first driver transistor and a first load transistor which are formed on a semiconductor substrate in order to form a first storage node;
   a second inverter having a second driver transistor and a second load transistor which are formed on said semiconductor substrate in order to form a second storage node;
   a first transfer transistor connected between said first storage node and a bit line to serve as a transistor connecting said memory cell to said bit line; and
   a second transfer transistor connected between said second storage node and a complementary-bit line to serve as a transistor connecting said memory cell to said complementary-bit line, wherein
   each of said memory cells has a layout in which
      said first transfer transistor, said first driver transistor, said second driver transistor and said second transfer transistor are connected in series and provided in a first semiconductor area formed as a segment having the shape of a straight line on said semiconductor substrate, said first load transistor is provided in a second semiconductor area formed as a segment on said semiconductor substrate, said second load transistor is provided in a third semiconductor area formed as a segment on said semiconductor substrate, and said first semiconductor area is sandwiched by said second semiconductor area and said third semiconductor area.

2. The semiconductor storage device according to claim 1 wherein said memory cells provided at adjacent locations separated away from each other in a direction perpendicular to a direction in which said first semiconductor area is stretched have the same layout.

3. The semiconductor storage device according to claim 1 wherein:

each of terminal portions each used for forming a contact for supplying a power-supply voltage of said second semiconductor area or said third semiconductor area in any particular one of said memory cells is stretched in a direction, in which said first semiconductor area with the shape of a straight line is stretched, to reach an adjacent memory cell separated away from said particular memory cell in said direction; and said contact for supplying said power-supply voltage to said first load transistor or said second load transistor is provided on the boundary between said particular memory cell and said adjacent memory cell to serve as a common contact shared by said particular memory cell and said adjacent memory cell.

4. The semiconductor storage device according to claim 1 wherein gate electrodes of said first driver transistor, said first load transistor, said first transfer transistor, said second driver transistor, said second load transistor and said second transfer transistor are provided in a layout in which the stretching direction of said gate electrodes crosses the stretching direction of said first semiconductor area, forming an angle greater than 45 degrees in conjunction with the stretching direction of said first semiconductor area.

5. The semiconductor storage device according to claim 1 wherein:

gate electrodes are formed in a layout in which the stretching direction of said gate electrodes crosses the stretching direction of said first semiconductor area, forming a right angle in conjunction with the stretching direction of said first semiconductor area; and said gate electrodes include a common gate electrode shared by said first driver transistor and said first load transistor as well as a common gate electrode shared by said second driver transistor and said second load transistor.

6. A method for manufacturing a semiconductor storage device including a plurality of integrated memory cells each including a first inverter having a first driver transistor and a first load transistor which are formed on a semiconductor substrate in order to form a first storage node, a second inverter having a second driver transistor and a second load transistor which are formed on said semiconductor substrate in order to form a second storage node, a first transfer transistor connected between said first storage node and a bit line to serve as a transistor connecting said memory cell to said bit line, and a second transfer transistor connected between said second storage node and a complementary-bit line to serve as a transistor connecting said memory cell to said complementary-bit line, said method comprising the steps of:

carrying out a process to form a first semiconductor area formed as a segment having the shape of a straight line on said semiconductor substrate to serve as an area in which said first transfer transistor, said first driver transistor, said second driver transistor and said second transfer transistor are provided by connecting said first transfer transistor, said first driver transistor, said second driver transistor and said second transfer transistor to each other in series, form a second semiconductor area formed as a segment on said semiconductor substrate to serve as an area in which said first load transistor is provided and form a third semiconductor area formed as a segment on said semiconductor substrate to serve as an area in which said second load transistor is provided;

carrying out a process to form gate insulation films composing said first driver transistor, said first load transistor, said first transfer transistor, said second driver transistor, said second load transistor and said second transfer transistor in said first semiconductor area, said second semiconductor area and said third semiconductor area;

carrying out a process to form gate electrodes of said first driver transistor, said first load transistor, said first transfer transistor, said second driver transistor, said second load transistor and said second transfer transistor on said gate insulation films in said first semiconductor area, said second semiconductor area and said third semiconductor area; and carrying out a process to form source and drain areas composing said first driver transistor, said first load transistor, said first transfer transistor, said second driver transistor, said second load transistor and said second transfer transistor in said first semiconductor area, said second semiconductor area and said third semiconductor area, wherein in a process to form said first semiconductor area, said second semiconductor area and said third semiconductor area, a layout is formed on said semiconductor substrate as a layout in which said first semiconductor area is sandwiched by said second semiconductor area and said third semiconductor area.

7. The method for manufacturing the semiconductor storage device, according to claim 6, wherein said process to form said first semiconductor area, said second semiconductor area and said third semiconductor area includes the steps of:

carrying out a sub-process of forming a mask layer for protecting said second semiconductor area and said third semiconductor area; and carrying out a sub-process of injecting ions each serving as an impurity of a first conductivity type onto said first semiconductor area in an inclined direction relative to said semiconductor substrate with said mask layer used as a mask.

8. The method for manufacturing the semiconductor storage device, according to claim 6, wherein said memory cells provided at adjacent locations separated away from each other in a direction perpendicular to a direction in which said first semiconductor area having the shape of a straight line is stretched are formed to have the same layout.

9. The method for manufacturing the semiconductor storage device, according to claim 6, wherein:

each of terminal portions each used for forming a contact for supplying a power-supply voltage of said second semiconductor area or said third semiconductor area in any particular one of said memory cells is stretched in a direction, in which said first semiconductor area with the shape of a straight line is stretched, to reach an adjacent memory cell separated away from said particular memory cell in said direction; and said contact for supplying said power-supply voltage to said first load transistor or said second load transistor is provided on the boundary between said particular memory cell and said adjacent memory cell to serve as a common contact shared by said particular memory cell and said adjacent memory cell.

10. The method for manufacturing the semiconductor storage device, according to claim 6, wherein gate electrodes of said first driver transistor, said first load transistor, said first transfer transistor, said second driver transistor, said second load transistor and said second transfer transistor are provided in a layout in which the stretching direction of said gate electrodes crosses the stretching direction of said first semiconductor area, forming an angle greater than 45 degrees in conjunction with the stretching direction of said first semiconductor area.

11. The method for manufacturing the semiconductor storage device, according to claim 6, wherein:

gate electrodes are formed in a layout in which the stretching direction of said gate electrodes crosses the stretching direction of said first semiconductor area, forming a right angle in conjunction with the stretching direction of said first semiconductor area having the shape of a straight line; and said gate electrodes include a common gate electrode shared by said first driver transistor and said first load transistor as well as a common gate electrode shared by said second driver transistor and said second load transistor.

* * * * *